United States Patent
AlQahtani et al.

(10) Patent No.: US 11,441,390 B2
(45) Date of Patent: Sep. 13, 2022

(54) MULTILEVEL PRODUCTION CONTROL FOR COMPLEX NETWORK OF WELLS WITH SMART COMPLETIONS

(71) Applicant: Saudi Arabian Oil Company, Dhahran (SA)

(72) Inventors: Ghazi Dhafer AlQahtani, Dhahran (SA); Shahid Manzoor, Khobar (SA); Hisham Salem, Dhahran (SA); Tareq Shaalan, Dhahran (SA); Zhen Chen, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 216 days.

(21) Appl. No.: 16/922,503

(22) Filed: Jul. 7, 2020

(65) Prior Publication Data
US 2022/0010635 A1    Jan. 13, 2022

(51) Int. Cl.
*E21B 34/16*        (2006.01)
*G06F 30/20*        (2020.01)
*G05D 7/01*         (2006.01)

(52) U.S. Cl.
CPC ............ *E21B 34/16* (2013.01); *G05D 7/0113* (2013.01); *G06F 30/20* (2020.01); *E21B 2200/02* (2020.05)

(58) Field of Classification Search
CPC ....... G06F 30/20; G05D 7/0113; E21B 34/16; E21B 2200/02
See application file for complete search history.

(56) References Cited

U.S. PATENT DOCUMENTS

| | | | |
|---|---|---|---|
| 8,290,632 B2 | 10/2012 | Briers et al. | |
| 9,816,353 B2* | 11/2017 | Rashid | E21B 43/12 |
| 9,864,353 B2* | 1/2018 | Tonkin | G05B 15/02 |
| 10,125,586 B2* | 11/2018 | Balan | E21B 43/162 |
| 2007/0271077 A1 | 11/2007 | Kosmala et al. | |
| 2012/0130696 A1* | 5/2012 | Davidson | G06Q 10/06375 703/10 |
| 2012/0278053 A1* | 11/2012 | Garcia | E21B 43/00 703/10 |

(Continued)

OTHER PUBLICATIONS

Foss et al., "Process control in the upstream petroleum industries," Proceedings of the 2011 4th Symposium on Advanced Control of Industrial Processes, May 2011, 7 pages.

(Continued)

*Primary Examiner* — Nicole Coy
(74) *Attorney, Agent, or Firm* — Fish & Richardson P.C.

(57) ABSTRACT

Systems and methods include a computer-implemented method for performing an advanced control policy for a group of wells. Choke settings are applied to one or more control elements of each well in a group of wells. Rig control settings are applied to the group of wells. The rig control settings define, for each rule in a set of rules: a rule count limiting a number of times a rule is to be executed in a simulation run and a rule frequency identifying a time frequency by which the rule is to be executed during the simulation run. Settings are received for targets and constraints for the group of wells. The simulation run is executed for the group of wells using the choking settings, the rig control settings, and the settings for of the targets and constraints for the group of wells.

17 Claims, 15 Drawing Sheets

(56) References Cited

U.S. PATENT DOCUMENTS

2018/0209248 A1    7/2018  Patel et al.
2021/0198981 A1*   7/2021  Shaalan .................. G06F 30/28

OTHER PUBLICATIONS

PCT International Search Report and Written Opinion in International Appln. No. PCT/US2021/040633, dated Oct. 26, 2021, 18 pages.
Al-Qahtani et al., "Complex Well Modeling Workflow Enabling Full Field Optimization and Forward Decisions," SPE 120050, Society of Petroleum Engineers, Jan. 2009, 13 pages.
Emerick et al., "Production Optimization With Intelligent Wells," SPE 107261, Society of Petroleum Engineers, Jan. 2007, 9 pages.
Ilamah et al., "Field-Scale Production Optimization with Intelligent Wells," SPE-190827-MS, Society of Petroleum Engineers, Jun. 2018, 12 pages.
Khrulenko et al., "Approach for Full Field Scale Smart Well Modeling and Optimization," SPE 149926, Society of Petroleum Engineers, Jan. 2011, 12 pages.

* cited by examiner

MULTILEVEL PRODUCTION CONTROL FOR COMPLEX NETWORK OF WELLS WITH SMART COMPLETIONS

BACKGROUND

The present disclosure applies to smart well completions.

The day-to-day production philosophy for intelligent oil and gas fields is distinctively different from operating conventional oil and gas fields. In conventional fields, since zonal control is not available, an operator optimizes the production at the field level through optimization of individual wells. In intelligent fields, production optimization processes include control and management of each completion zone or lateral across all wells using inflow control valve (ICV) devices.

Existing reservoir dynamic simulators do not have sufficient modelling capabilities and flexibility to allow direct control/optimization of the ICV devices in response to the global field/group targets and constraints. Available group controls may only allow control of the subordinate wells, for example.

SUMMARY

The present disclosure describes techniques for providing multilevel production controls for complex networks of wells with smart completions. In some implementations, a computer-implemented method includes the following. Choke settings are applied to one or more control elements of each well in a group of wells. Rig control settings are applied to the group of wells. The rig control settings define, for each rule in a set of rules: a rule count limiting a number of times a rule is to be executed in a simulation run and a rule frequency identifying a time frequency by which the rule is to be executed during the simulation run. Settings are received for targets and constraints for the group of wells. The simulation run is executed for the group of wells using the choking settings, the rig control settings, and the settings for of the targets and constraints for the group of wells.

The previously described implementation is implementable using a computer-implemented method; a non-transitory, computer-readable medium storing computer-readable instructions to perform the computer-implemented method; and a computer-implemented system including a computer memory interoperably coupled with a hardware processor configured to perform the computer-implemented method/ the instructions stored on the non-transitory, computer-readable medium.

The subject matter described in this specification can be implemented in particular implementations, so as to realize one or more of the following advantages. First, applying multilevel optimization techniques can enable the control of inflow control valves (ICVs) so as to honor field targets and constraints. For example, optimization can refer to achieving field target and constraints that result in production results greater than a predefined threshold. The techniques can be used, for example, to achieve full potential from each lateral in multilateral wells. Second, group control policies can be used to manage and directly control ICV devices in intelligent completion (IC) systems. This can enable the generation of realistic production forecasts and the optimization of development plans for oil and gas fields developed with IC systems. Third, reproducing the actual ICV devices choking response to group constraints in dynamic models can help in optimizing fluid facilities size requirements and evaluating ICV device requirements in complex wells. Fourth, problems can be solved that are related to capping productivity potential from good laterals in multilateral wells in a certain field. Fifth, multilevel optimization can maximize production from wells while minimizing unwanted fluids (such as water or gas) by controlling ICVs in oil reservoirs. Sixth, smart well completions can be identified that are responsible in brining, high water cut, or gas oil ratio, controlling the wells to maximize production plateaus and field overall recovery. Seventh, field-level well management policies can be implemented in enhanced reservoir simulators. For example, the field-level well management policies can be implemented using applications. The applications can use control logic, ranges of ICV device responses to various group production targets/constraints, and the required interaction between group controls and well control policies to achieve optimal field development planning. The applications can include application code for field scale controls that regulate smart completions including ICVs and inflow control devices (ICDs).

The details of one or more implementations of the subject matter of this specification are set forth in the Detailed Description, the accompanying drawings, and the claims. Other features, aspects, and advantages of the subject matter will become apparent from the Detailed Description, the claims, and the accompanying drawings.

DESCRIPTION OF DRAWINGS

Like reference numbers and designations in the various drawings indicate like elements.

DETAILED DESCRIPTION

Figure 1:
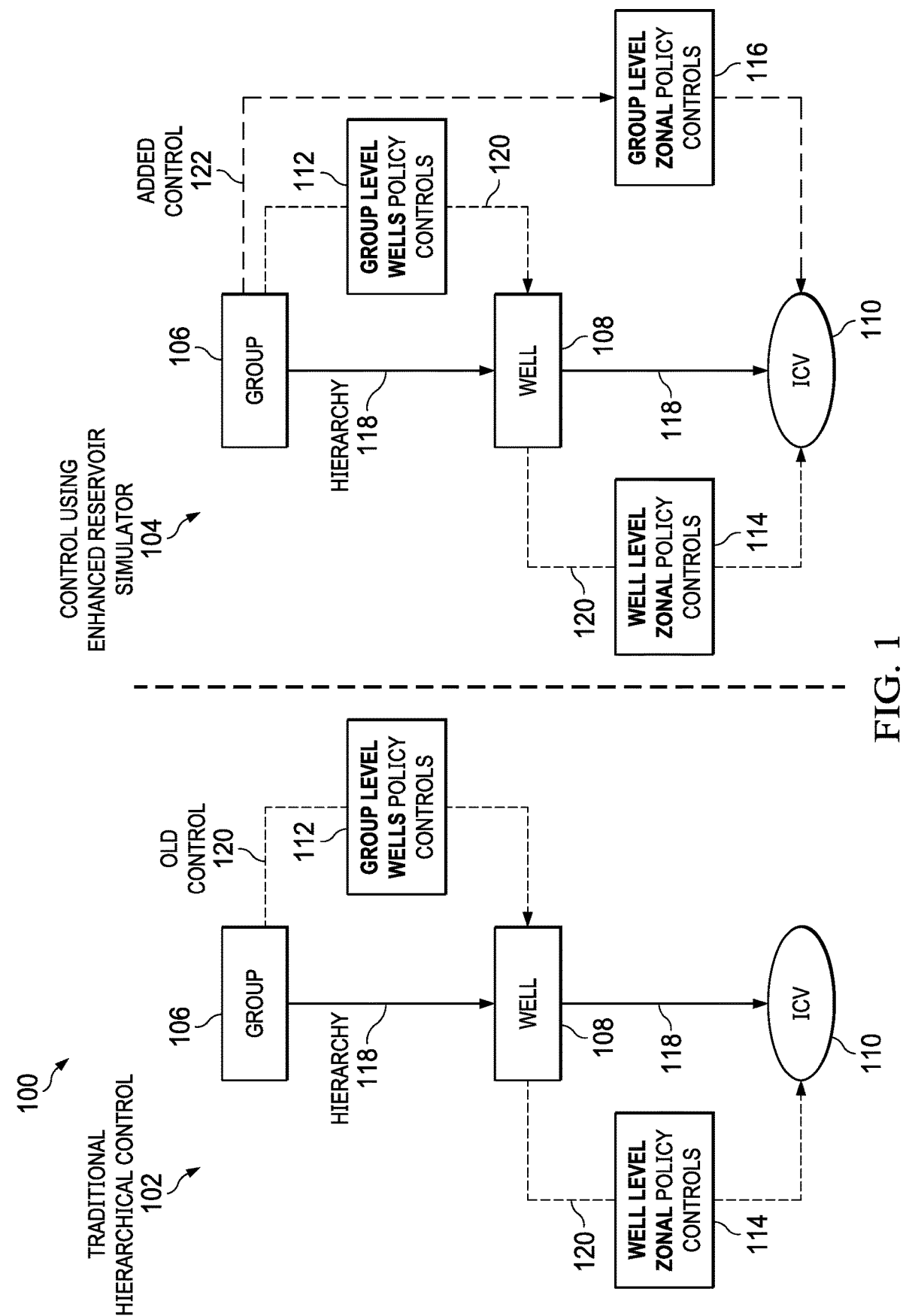
FIG. 1 is a block diagram showing a comparison between a conventional group/well and an advanced complex group/ well control policy for intelligent completion systems, according to some implementations of the present disclosure.

The following detailed description describes techniques for smart well completions. Various modifications, alterations, and permutations of the disclosed implementations can be made and will be readily apparent to those of ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

The present disclosure describes approaches for optimizing controls on smart well completions, including inflow control valves (ICVs) and inflow control devices (ICDs), to honor field-level target and constraints using reservoir simulation. For example, optimization can refer to achieving field target and constraints that result in production results greater than a predefined threshold. Different levels of controls can be used with dynamic models to regulate production from a field of interest. A first level of control can operate on field targets and constraints related to how much production is required from the field and limitations to be monitored at surface facilities gathering well production. Constraints can be related, for example, to how much water or gas can be handled by surface facilities. The second level of control can be associated with wells that produce oil or gas and that are usually constrained to certain production rates and water cut (WC) or gas oil ratio (GOR) constraints. Some fields can be divided into regions in which groups of wells constitute each region, depending on the field size. Wells can be vertical, slanted, horizontal, or multilateral. A third level of control can be associated with the completions that include ICVs, ICDs, or both that are typically installed in multilateral wells or single lateral wells to selectively control production from each completion zone.

The techniques of the present disclosure can be used with field scale reservoir models that include hundreds or thousands of conventional wells, including wells with ICVs, ICDs, or both. Controls that are used can follow field scale targets and constraints. Use of the techniques can improve production performance plans and generate optimum control policies for wells with ICVs and ICDs.

Different approaches can be used to direct correspondence between the field (as the first level) and the ICVs (as the third level). Direct relationships between the levels can provide advantages such as allowing wells to produce to their true potential without undue constraints. The approaches can increase a field's overall productivity (and ultimately, recovery factors).

Intelligent completion (IC) systems can incorporate permanent downhole sensors and surface-controlled downhole ICV devices. This can enable operators to monitor, evaluate, and actively manage production from different zones, intervals, and laterals in real time. For example, the term real time can correspond to events that occur within a specified period of time, such as within minutes or seconds. As a result of using IC systems, reservoir efficiency can be maximized by increasing production and increasing ultimate recovery. For example, production from different reservoir zones can be commingled, which can increase and accelerate production and net present value (NPV). Also, selective zonal control can enable effective management of water injection, gas, and water breakthrough, and individual zone productivity.

To address modelling limitations and challenges, an enhanced reservoir simulator can be supplemented with combinations of advanced management features of wells, groups, and complex wells. The features can allow a global field/group to directly control ICVs to meet the global field/group targets while honoring constraints of the wells and facilities.

FIG. 1 is a block diagram showing a comparison 100 between a conventional group/well and an advanced complex group/well control policy for intelligent completion systems, according to some implementations of the present disclosure. For example, a comparison is provided between a traditional hierarchical control 102 and a control 104 using an enhanced reservoir simulator. Each of the controls 102 and 104 includes a group 106, a well 108, an ICV 110, group level wells policy controls 112, and well-level zonal policy controls 114. The control 104 also includes group-level zonal policy controls 116. Connective lines and line styles in the comparison 100 include hierarchical lines 118, conventional controls 120, and added controls 122 corresponding to techniques of the present disclosure.

To demonstrate the merits of a modelling capability associated with the enhanced reservoir simulator, consider the following example of an oil field developed with 50 intelligent wells. Each well has three completion compartments, each compartment is controlled by an ICV device 110. The field has an overall production target of 200 thousand stock tank barrels per day (MSTBD), with total liquid and produced water constraints of 250 MSTBD and 100 MSTBD, respectively. Each well has a maximum liquid rate of 5 MSTBD and a minimum tubing head pressure (THP) of 300 pounds per square inch, absolute (psia). The field production strategy is to maintain the overall oil target while honoring the water handling constraint by choking back the highest-WC ICV devices and opening up ICV devices with the lowest WC. However, limitations of a conventional group/wells controls policy can limit the ability to achieve this field production strategy.

In some implementations, the field production strategy can be achieved by applying two levels of controls. A group/field-level control of subordinate wells can be used to achieve the group target and honor its constraints. Each well can be allocated a target rate according to its restricted oil potential and other prioritization parameter(s). A well-level control of subordinate ICV devices can also be used. The rate allocated to each well (assigned by the group control) can be apportioned to the well's subordinate ICV devices in such a way as to prioritize offtake from ICV devices with the lowest WC rates and highest oil rates. At the same time, the well constraints can be honored in terms of the minimum THP and the maximum liquid rate. As a field becomes mature and WC increases, the overall production stream can be constrained by the water/liquid handling limits. The group constraint can trigger a production restriction to each individual well, dependent on its WC level.

Figure 2B:
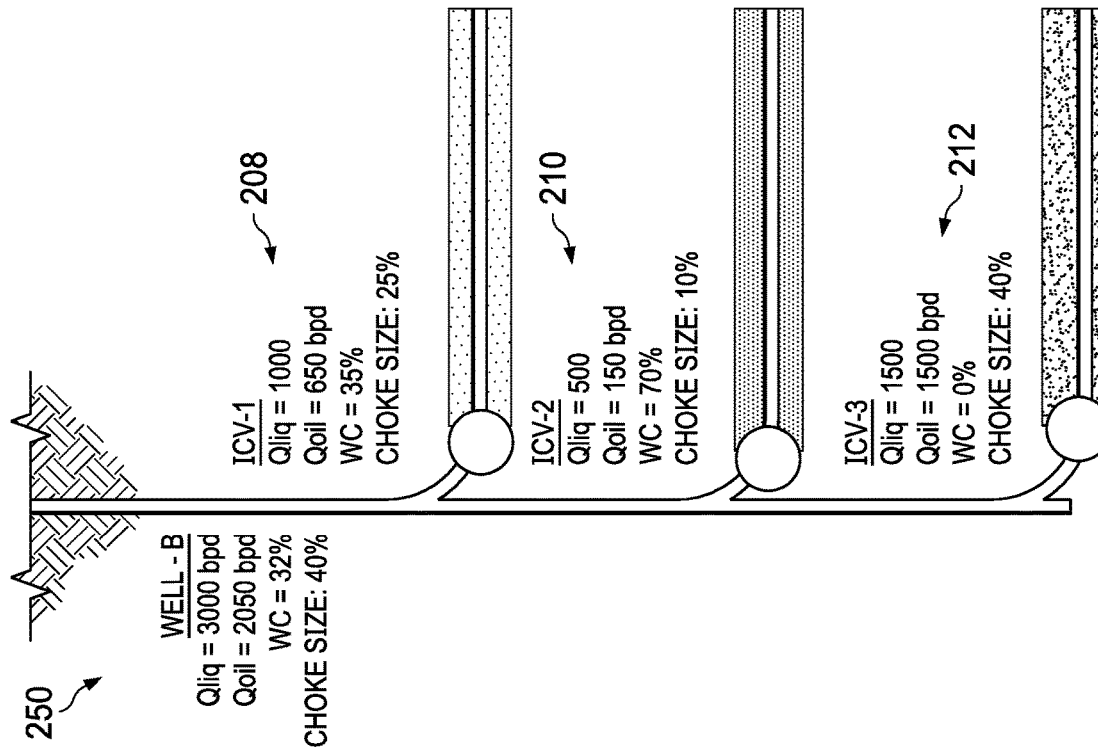
FIGS. 2A and 2B are diagrams showing examples of zonal and well production allocation using a conventional control policy, according to some implementations of the present disclosure.
Figure 2A:
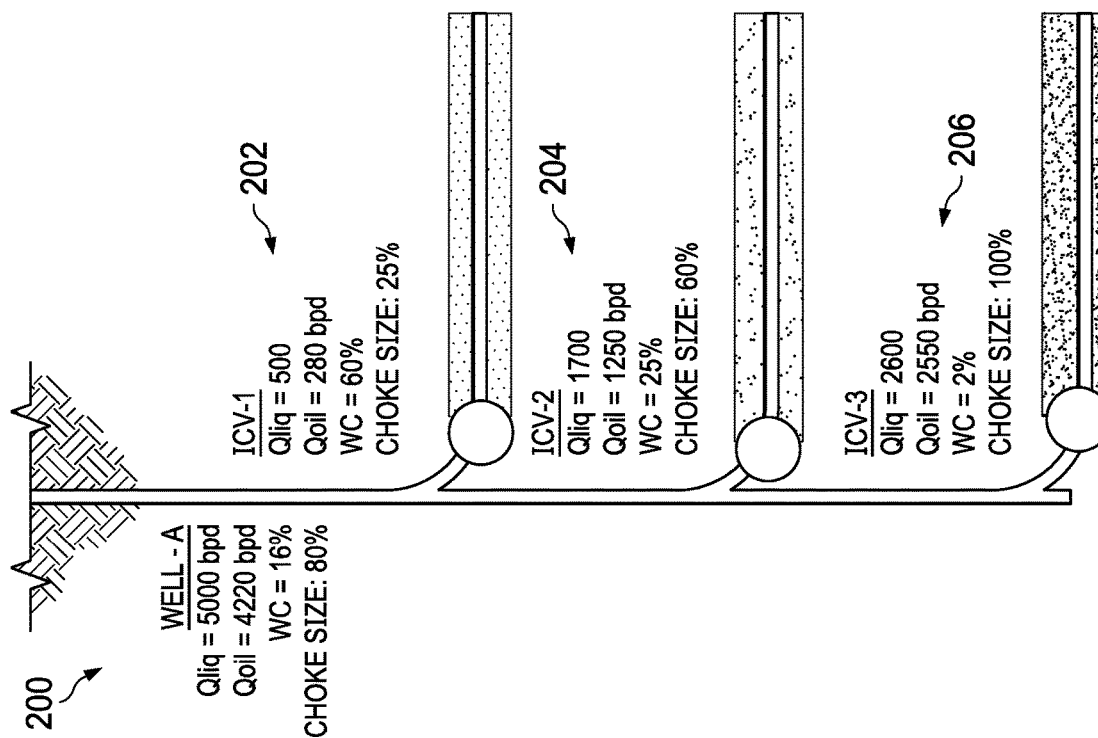

FIGS. 2A and 2B are diagrams showing examples of zonal and well production allocation using a conventional control policy, according to some implementations of the present disclosure. For instance, FIG. 2A shows a Well-A production 200 which produces drier oil compared to a Well B production 250 (FIG. 2B). As such, the Well-A production 200 will be allocated a greater quantity of liquid (Ql) compared to the wet Well-B. At each well, the well control policy can be apportioned to the well's production allocation target among the subordinate ICV devices 202-212. The ICV device with lowest WC will be beaned up the most, for example, during which the opening size for the controlling valve is increased to allow the controlled completion interval to produce at a higher rate. As a result of the combined two levels of controls, Well-B can have a restricted flow due to the group control policy, leading to excessive chocking of ICV-3 in well B (ICV device 212), though ICV-3 in well B has greater dry oil potential than ICV-2 in well A (ICV device 204).

Complex wells management can be used with enhanced reservoir simulators to provide an advanced group/well control policy that allows the group to directly control all subordinate ICV devices across the field. The new control logic can be used to scan all ICV devices belonging to the group, rank each ICV device (for example, according to its potential, WC, or other parameters), and prioritize production offtake according to pre-specific criteria. This can occur for the group rate target while honoring the group/well operational constraints.

Figure 3B:
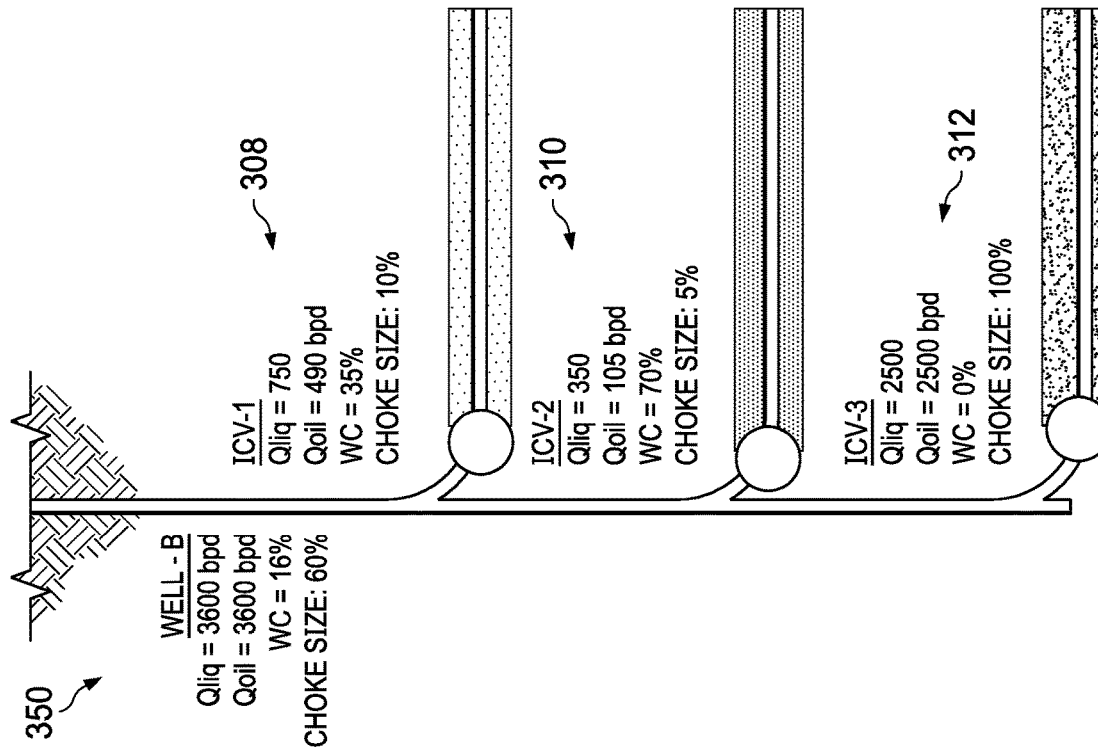
FIGS. 3A and 3B are diagrams showing examples of zonal and wells production allocation using an advanced complex wells management control policy, according to some implementations of the present disclosure.
Figure 3A:
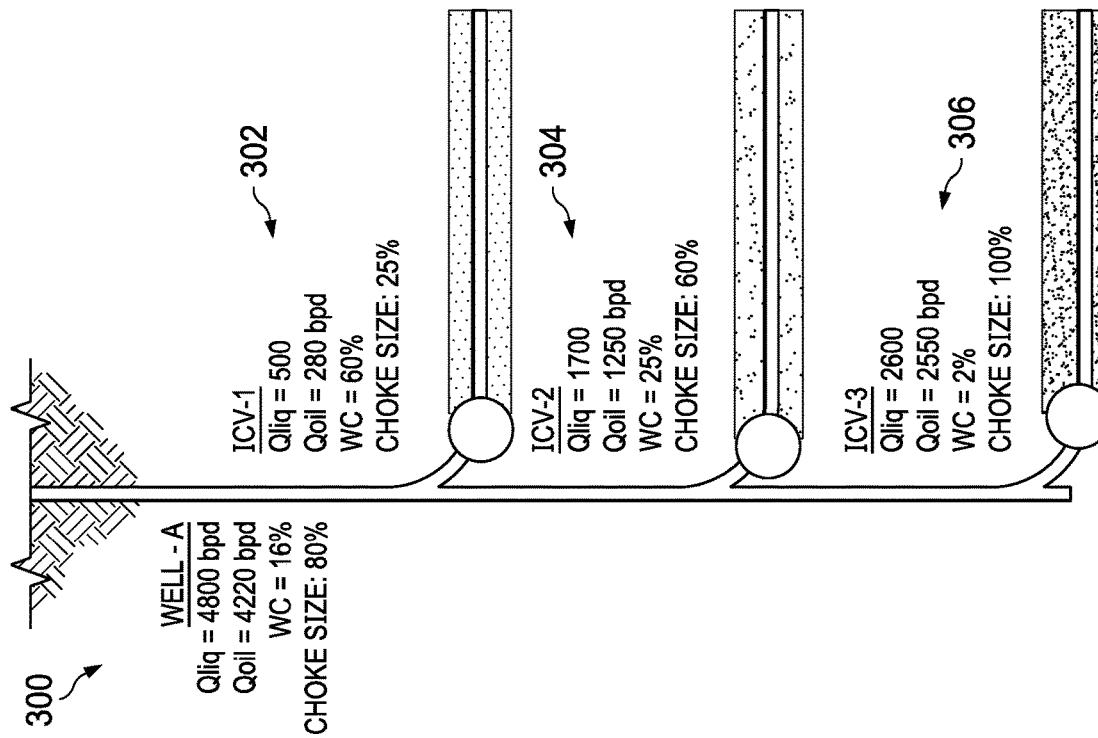

FIGS. 3A and 3B are diagrams showing examples of zonal and wells production allocation using an advanced complex wells management control policy, according to some implementations of the present disclosure. As shown in FIGS. 3A and 3B, complex wells management can be used to optimize the group production and release maximum potential from all ICV devices.

Field Management of Complex Wells Equipped with Control Devices

In a typical reservoir simulation, a mathematical model that includes a set of differential equations is used. After being discretized, the mathematical model is solved for desired flow variables. Reservoir boundary conditions can be in the form of well controls that are used to match historical data, define operational limits for reservoir forecasting, and set to optimize field production. Field management is a key component of a reservoir simulator, which integrates a well model with reservoir material balance equations. Generalized field management schemes can be used to control multilateral or complex wells equipped with control devices, while honoring all producing and injecting wells and/or groups targets and constraints, with certain field development objectives. For the description of field management of complex wells equipped with control devices, a general name "control-element" is used for representing ICVs, ICDs, perforation, and branches of a complex well. Control-elements can be classified into passive and active elements (for example, as described with reference to FIG. 4).

ICVs can be regarded as active control elements, meaning that the ICVs can be choked, unchoked, or autonomously set to prescribed positions or openings to optimize production. ICDs are generally regarded as passive devices or passive control elements, as ICDs require intervention or workover to change flow parameter settings. Having the option to control perforation or branches is also implemented as a passive element and is regarded as a passive control.

As shown in FIG. 1, in order to control or filter out offending control elements, three layers of triggers/conditions/filters are needed: 1) group triggers, 2) well triggers, and 3) device triggers. Subject to violation of these triggers, a control element action can be applied to offending control elements. A special rule structure can be developed to specify a field management control policy. Two types of control policies can be developed: a simple control policy and an advanced control policy. After starting with a simple control policy, an advanced control policy can be used to optimize field production.

Simple Control Policy

Figure 4:
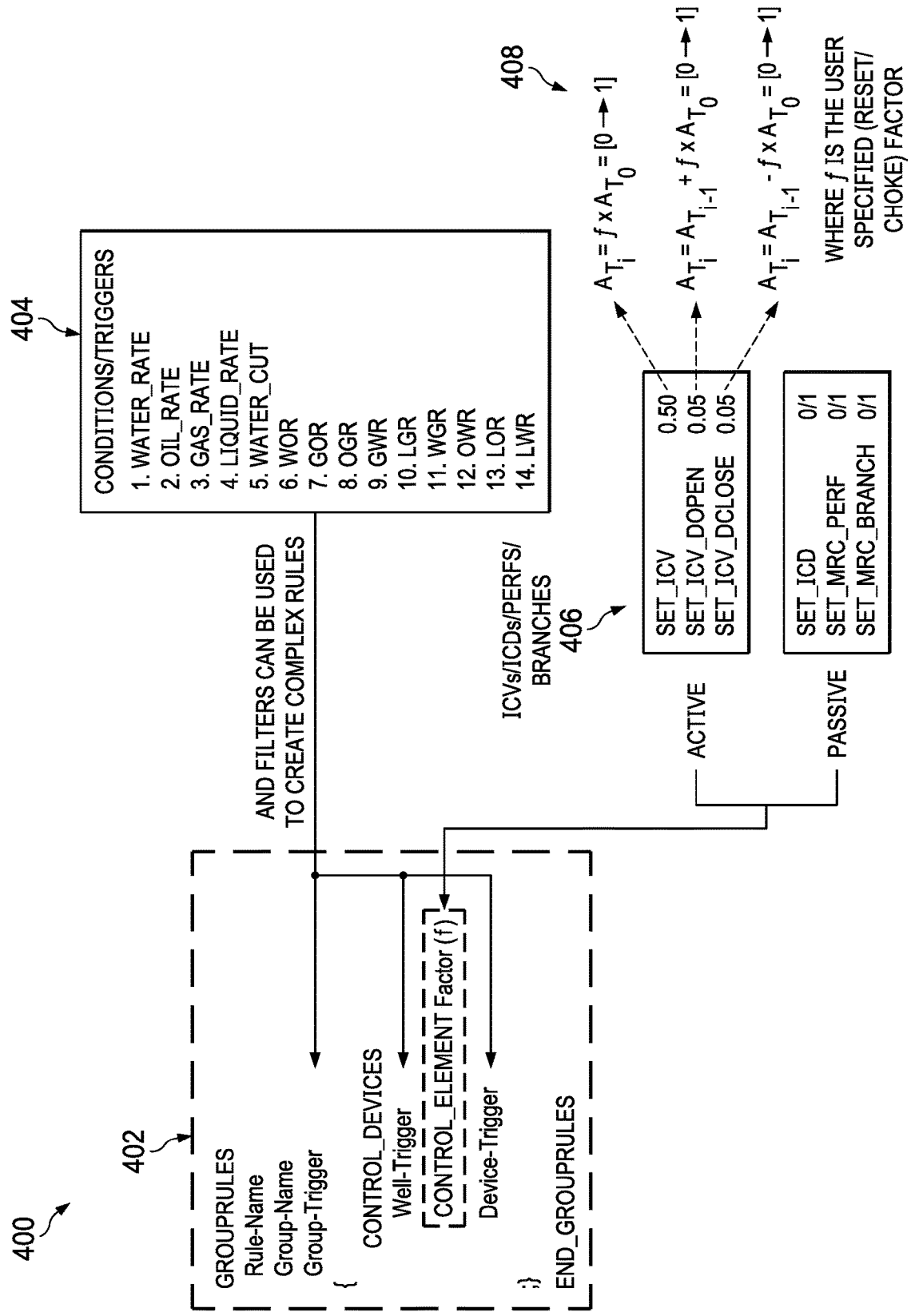
FIG. 4 is a schematic showing examples of code and tables used for simple field management of complex wells equipped with control elements, according to some implementations of the present disclosure.

FIG. 4 is a schematic showing examples of code and tables 400 used for simple field management of complex wells equipped with control elements, according to some implementations of the present disclosure. Each rule of a rule set 402 can be assigned a unique rule name and an associated group name. The rule set 402 can be integrated with three layers of triggers/conditions 404, 406, and 408 that are used to filter out desired/offending devices. Several conditions can be implemented to specify triggers.

The code and tables 400 can support a developed approach for a simple control policy to manage combinations or configurations of ICVs, ICDs, completions, and branches. Each control element can be used to specify an action type or a reset factor. For ICVs, an option to choke and unchoke can be provided. As an example, assume that an initial opening area of an ICV is $A_0$ and a reset factor is specified as f. Then, subject to violation of triggers and action type, the opening area is changed by a factor $f \times A_0$. For passive elements (for example, ICDs, perforation, and branches), control positions can be limited to 1 (or a default of a fully open setting) or 0 (fully closed).

Figure 5:
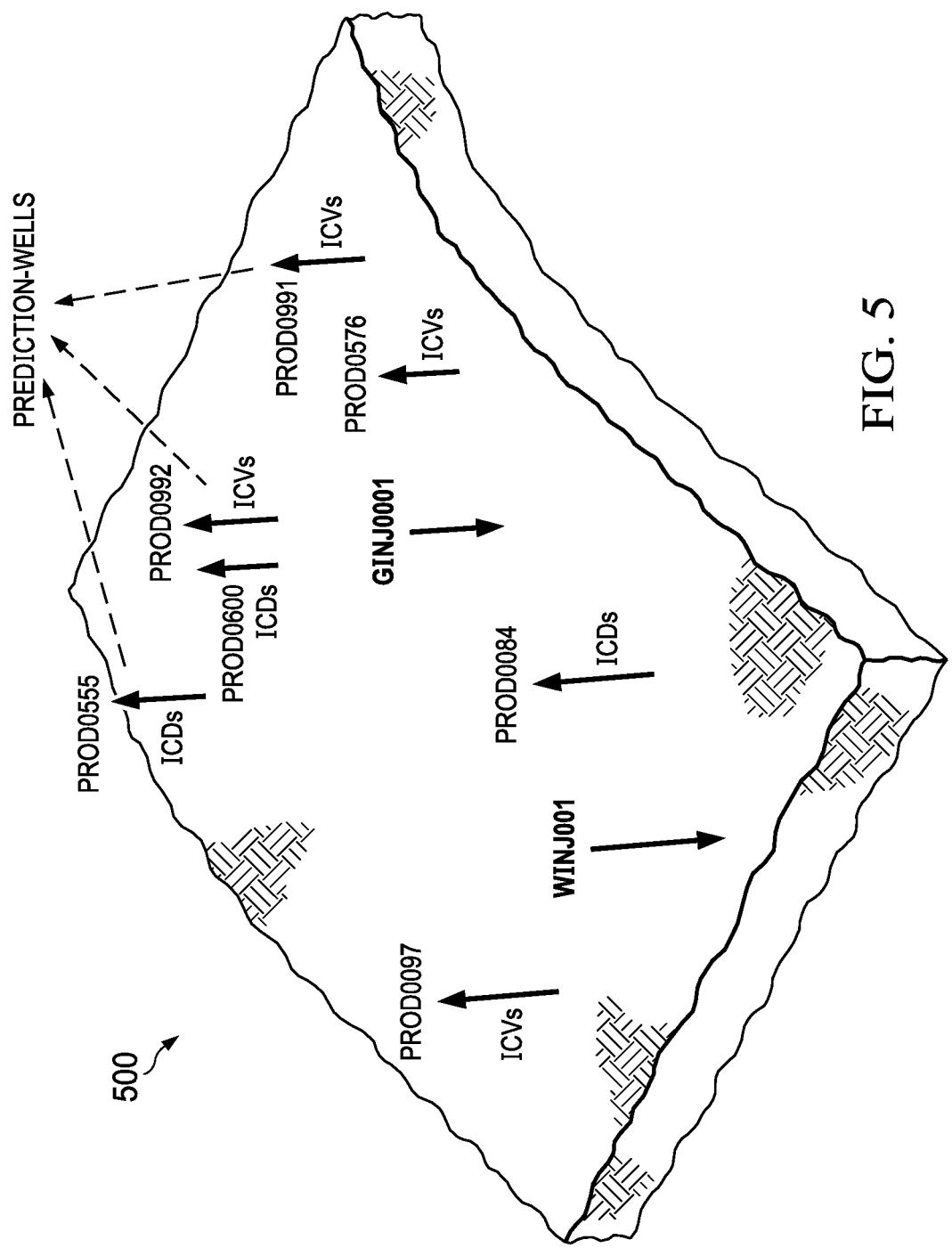
FIG. 5 is a drawing of an example of a test case used to demonstrate the capability of field management of inflow control valves (ICVs) and inflow control devices (ICDs), according to some implementations of the present disclosure.

The use and capabilities of the simple control policy can be demonstrated by simulating a flow field using a test case. The selected test case can be a black oil model, for example, as depicted in FIG. 5. Domain discretization can be performed by employing a uniform structured grid, with 350× 201×80 cells, for example. Grid size can be, for example, 41.5 meters (m) in areal direction with a layer thickness of 7.4 m, for example. The model that is selected can be history matched, where the planar permeability tensor is isotropic and heterogeneous, for example, where $k_x = k_y = [0.1$ to $4000]$ mD, and where, in the vertical direction, $k_z = 0.1 \times k_x$. The reference porosity can range between $\varphi = [0.07$ to $0.35]$, for example. Rock or saturation region properties can be specified or defined by oil-water and oil-gas saturation tables, for example, with minimum residual saturations of water $S_{orw} = 0.31$ and that of gas $S_{org} = 0.15$ in their respective two-phase system. In some implementations, a Stone-II model can be used to estimate three-phase relative permeability from the two-phase data. The model that is selected can be use 7 producers (4 historical and 3 prediction), where all are complex wells and are equipped with ICVs, ICDs, or both. In addition, for pressure support, one gas injector and one water injector completed, as open hole can be used.

FIG. 5 is a drawing of an example of a test case 500 used to demonstrate the capability of field management of ICVs and ICDs, according to some implementations of the present disclosure. For example, FIG. 5 displays geometry and well placement in the selected test case.

After a history period, using in prediction starting from January, 2020, an field oil target was set to be 44,000 barrels per day (BPD), with maximum gas constraints set at 60,000 thousand standard cubic feet per day (MSCFD). Liquid handling capacity is set at 50,000 BPD.

Figure 6:
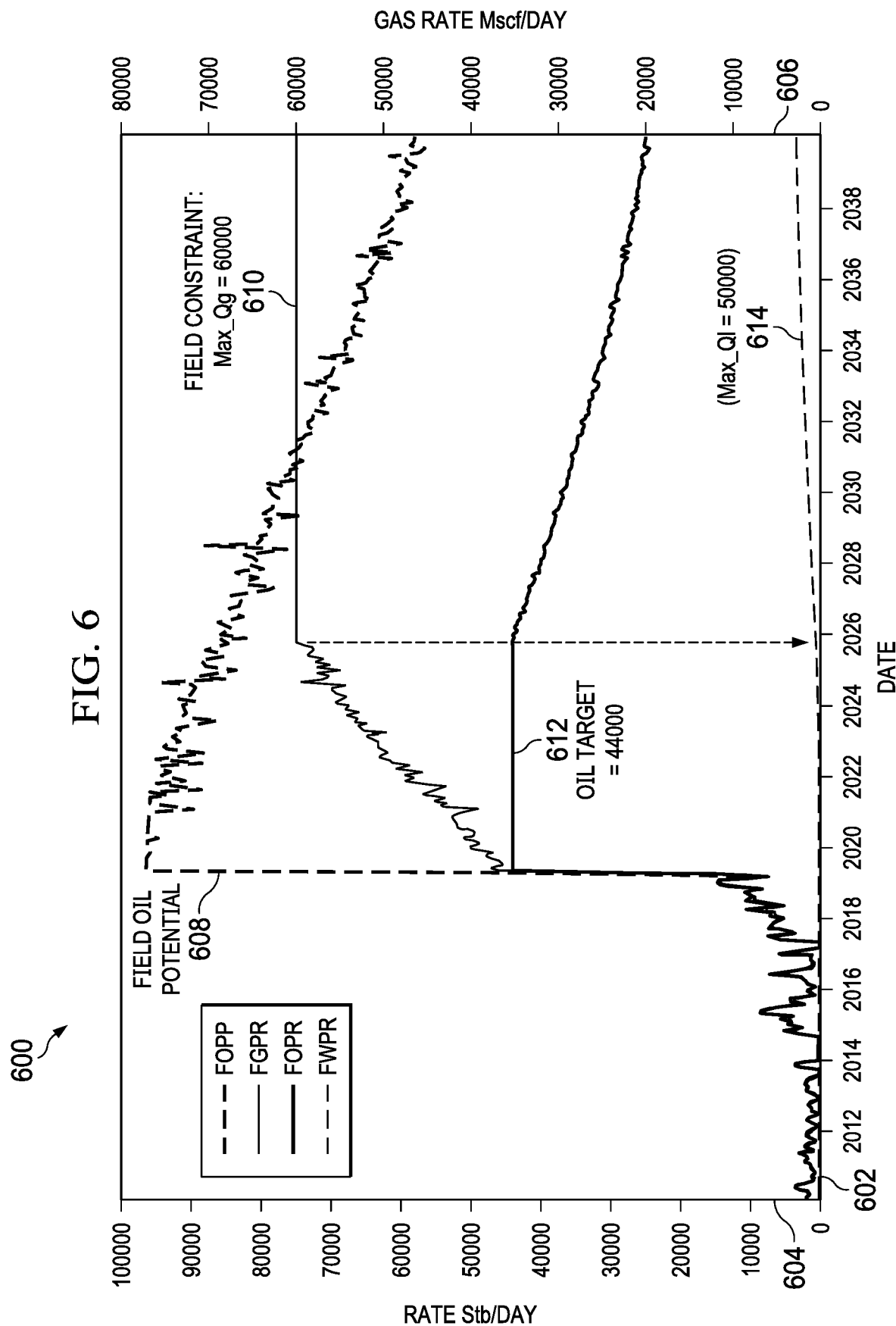
FIG. 6 is a graph showing an example of estimated field production performance using default settings of ICVs and ICDs, according to some implementations of the present disclosure.
Figure 7A:
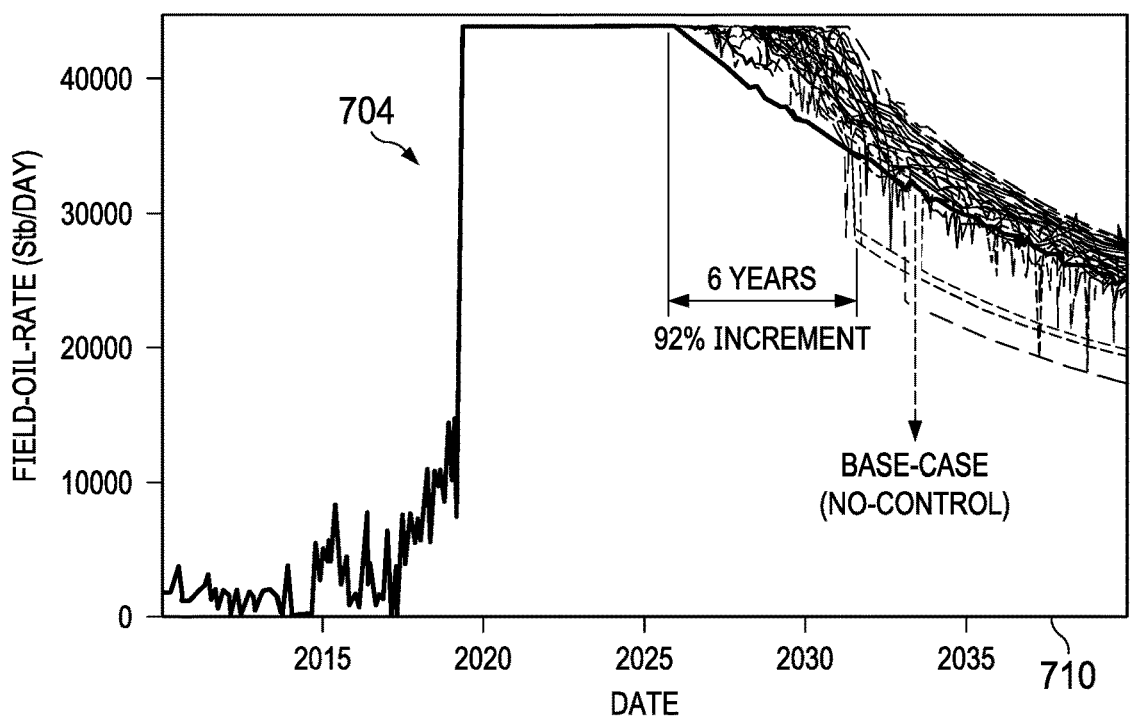
FIGS. 7A-7D are graphs showing examples of test case results of the parametrized cases, according to some implementations of the present disclosure.
Figure 7B:
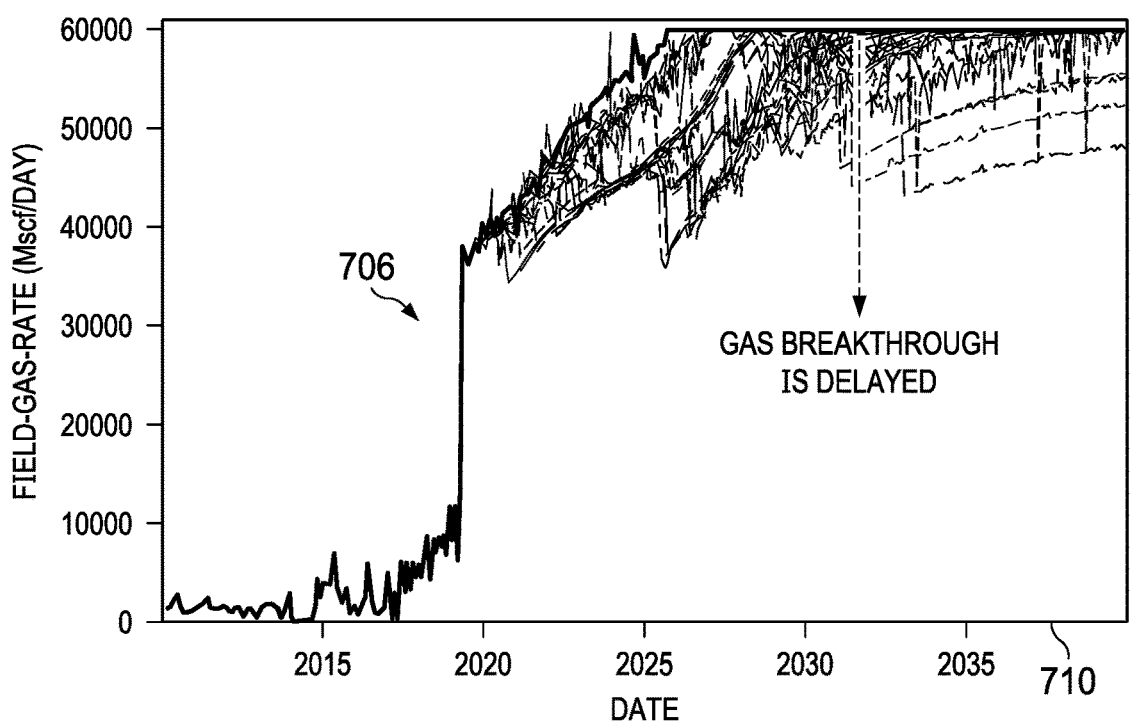
Figure 7C:
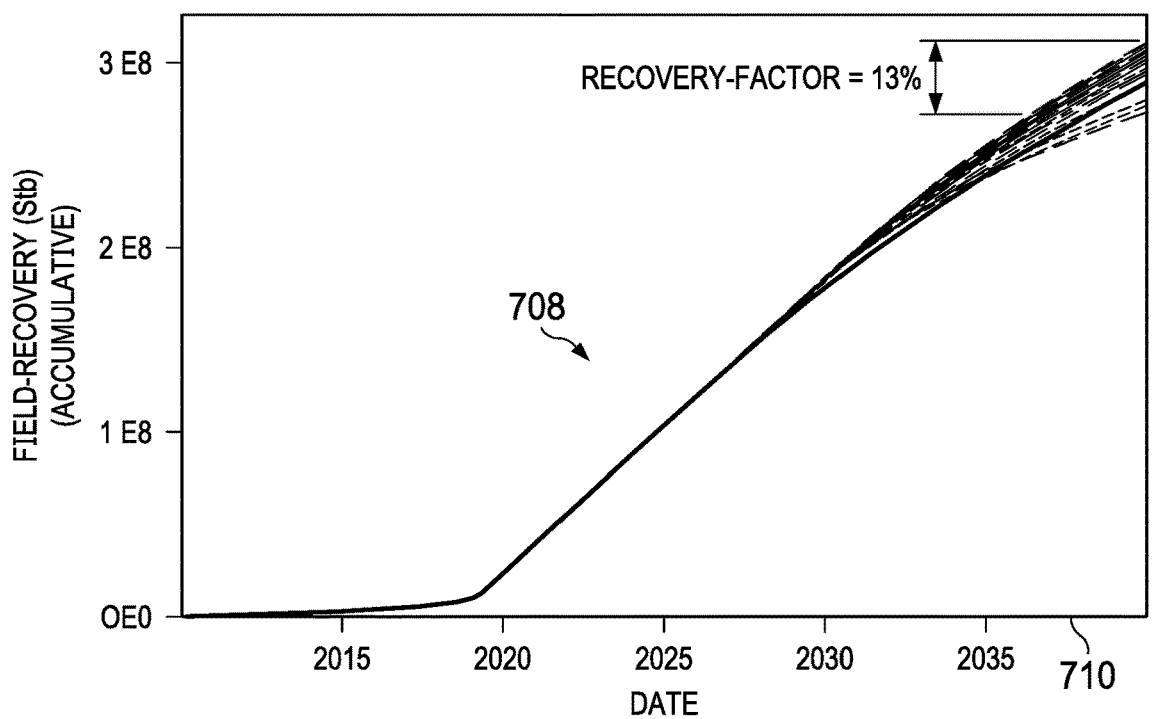
Figure 7D:
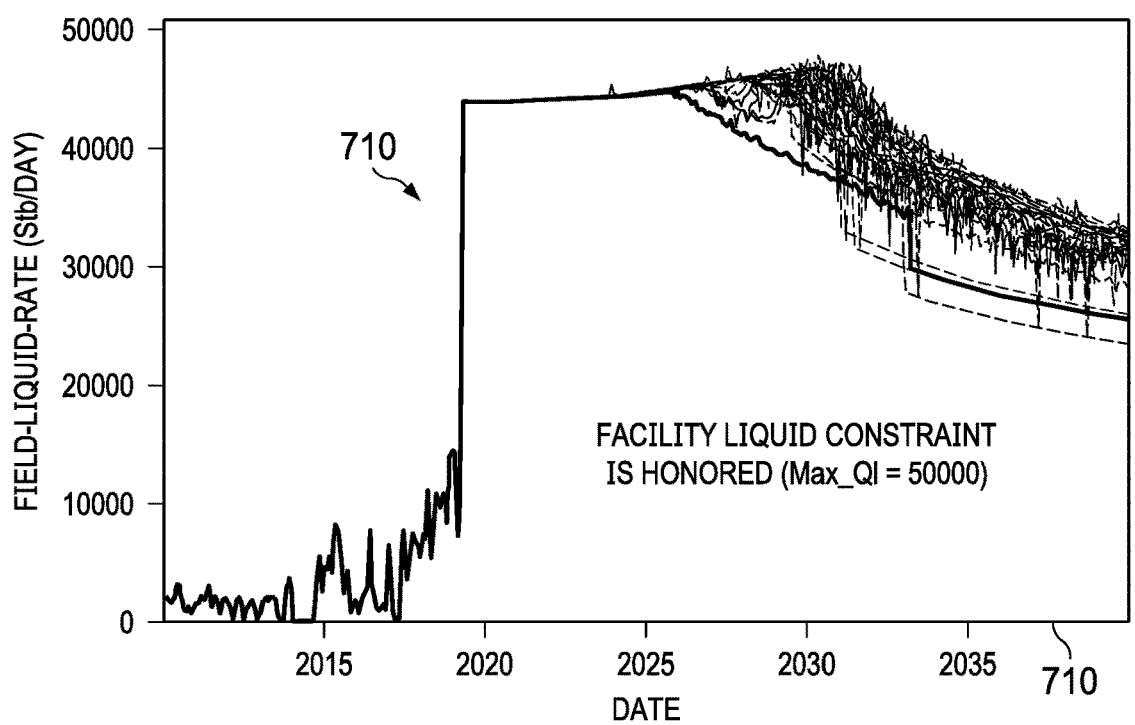

FIG. 6 is a graph showing an example of estimated field production performance 600 using default settings of ICVs and ICDs, according to some implementations of the present disclosure. Specifically, field oil potential is shown in FIG. 6, where after July, 2025, the field is expected to reach a maximum gas constraint and decline from a 44,000 BPD plateau. Plots on the graph are plotted relative to time 602, production rate 604, and gas rate 606. The plots include field oil potential 608, a field constraint 610 of a maximum quantity of gas (Qg) of 60,000, an oil target 612 of 44,000 STD/day, and a maximum Ql constraint 614 of 50,000.

By analyzing field oil production potential, if the gas breakthrough can be delayed by managing ICVs and ICDs, then a plateau in production can be extended with more recovery. As a next step, subject to field target and constraints, the test can be studied by managing ICVs and ICDs to different positions/settings, so as to delay gas breakthrough, extending the plateau and recovery factor.

For the case at hand, in order to delay gas breakthrough, field management rules can be used for controlling ICVs and ICDs based on one or both of their GOR and gas production rates. To this end, using the simple controls described with reference to FIG. 4, the control policy can be parametrized. Doing so can allow the use of different trigger values for group, well, and devices triggers. Several scenarios, each with different trigger values, can be created and run independently.

FIGS. 7A-7D are graphs showing examples of test case results of the parametrized cases, according to some implementations of the present disclosure. The test case results can result from simple controls, where control devices settings and positions are optimized subject to field target and/or constraints. FIGS. 7A-7D include graphs for field oil rate 702 (standard bushels per day (STBD)), field gas rate 704 (MSCFD), accumulative field recovery 706 (STBD), and field liquid rate 708 (STBD). As shown in FIGS. 7A-7D a control policy exists which, if used, then plateau is increased by 100% with 13% more recovery.

Advanced Control Policy

The simple control policy, previously described, has some limitations. For example, all devices passing triggers are to be choked back uniformly, regardless of their non-uniform WC or GOR. As such, there is no reset/choking strategy to compute non-uniform choking factors. In addition, triggers are not enforced as constraints. This means that after choking actions are applied, water and gas production may still be higher than the trigger values. Also, there is no option to up-scale or down-scale the choking factor. Furthermore, the simple control policy does not account for a number of rule counts associated with a need to retire a field management rule, and rule frequencies are not implemented. Lastly, in the simple control policy, there is no option to control the most offending control devices. These types of options, however, can be implemented in an advanced control policy, and are summarized in FIG. 8.

Figure 8:
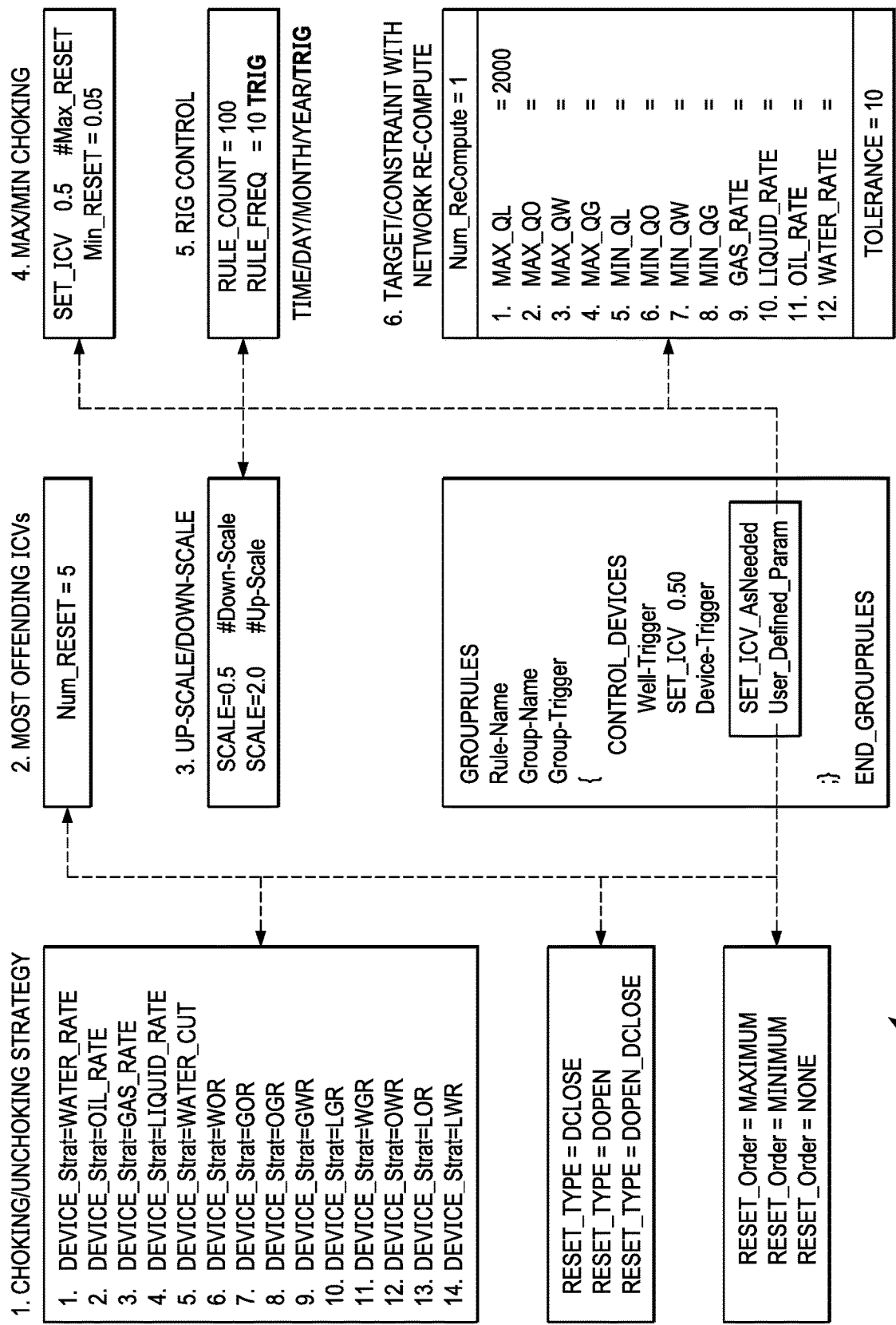
FIG. 8 is a schematic showing examples of code and tables used for advanced control policy performed subject to production optimization and field management, according to some implementations of the present disclosure.

FIG. 8 is a schematic showing examples of code and tables 800 used for advanced control policy performed subject to production optimization and field management, according to some implementations of the present disclosure. Options implemented in the advanced control policy can be specified after a SET_ICV_ASNeeded keyword, for example, in place of a User_Defined_Param keyword. In some implementations, these options can be classified into six categories.

Using a first category associated with a choking strategy, a number of choking strategies can be implemented. For a set of devices passing all three layers of triggers, choking or a device reset factor can be computed based on the specified choking strategy. For example, if water cut is specified as a choking strategy, then using an associated device water-cut, the choking/reset factor can be computed as a value between 0 and 1, where 1 implies fully closed/choked/reset and 0 corresponds to no change in the existing settings.

A second category is associated with control top and most offending devices. For example, in a list of devices passing all three layers of triggers, there could be only a few devices which are the most offending. An option to control the top most-offending devices can be implemented. The choking factor can be computed using a user-specified reset strategy. In the case in which the number of devices passing triggers exceed the user-specified number of reset devices, the reset factor can be applied to a user-specified number of the top most-offending devices only.

A third category can be associated with an upscale and downscale choking factor. An option to upscale (or downscale) the reset factor can also be implemented. This is to increase (or decrease) the effect of choking.

A fourth category can be associated with a maximum/minimum choking factor. Based on a reset strategy, a reset factor may be computed, and the reset factor may be very high or very low and thus impractical. In the advanced control policy, the upper and lower limits for the choking factor can be specified. A minimum choking factor can be specified explicitly by choosing keyword "Min Reset", for example, per the keyword "SET_ICV", where a real value can correspond to an upper limit for a choking/reset factor.

A fifth category can be associated with rig control options. For example, the advanced control policy can be used in conjunction with rig control options. To this end, a rule frequency and a rule count can be implemented. The rule frequency defines how frequently a rule should be acted upon, for example, every time step. The rule count specifies a maximum number of times a rule will be operated in a simulation run, and once a specified count is reached, the rule is retired.

A sixth category can be associated with enforcing triggers as constraints. For example, when reconfiguring control devices, important requirements can include a requirement to reset devices so as to meet a target or to honor a constraint. This option can be designed and used to iteratively reset choke/unchoke control devices so as to meet target or constraints. In order to strictly adhere to targets and constraints, this option can be linked with network re-computing, including re-solving wells to test the action.

The capabilities of the advanced control can be demonstrated by performing production optimization, resulting in simulating a simple test case. In the selected test case of a black oil model, the domain is discretized by employing a structured grid composed of 20×20×6 cells. The selected case includes 29 complex well producers, where all are equipped with ICVs. In addition, 14 injectors are completed as open hole and are designed to replace voidage.

Figure 9:
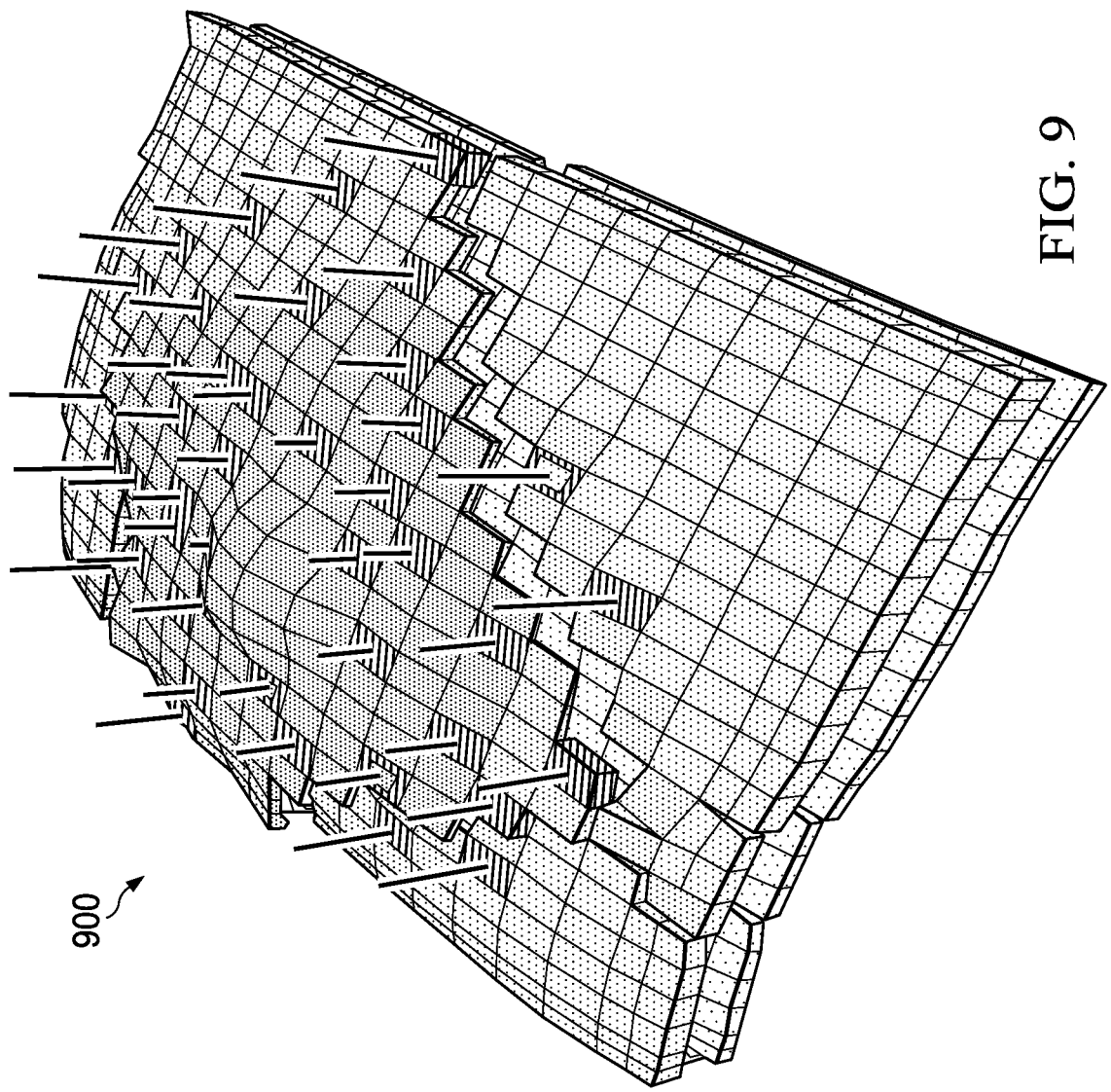
FIG. 9 is a drawing of an example of a test case used to demonstrate the advanced control policy, according to some implementations of the present disclosure.

FIG. 9 is a drawing of an example of a test case 900 used to demonstrate the advanced control policy, according to some implementations of the present disclosure. In a prediction starting from January, 2000, the test case is operated at a specified oil target producing 70,000 BPD, with a liquid handling capacity limit set to be 180,000 BPD. Reference/base run with default settings of control devices (fully open) is displayed in FIG. 10.

Figure 10:
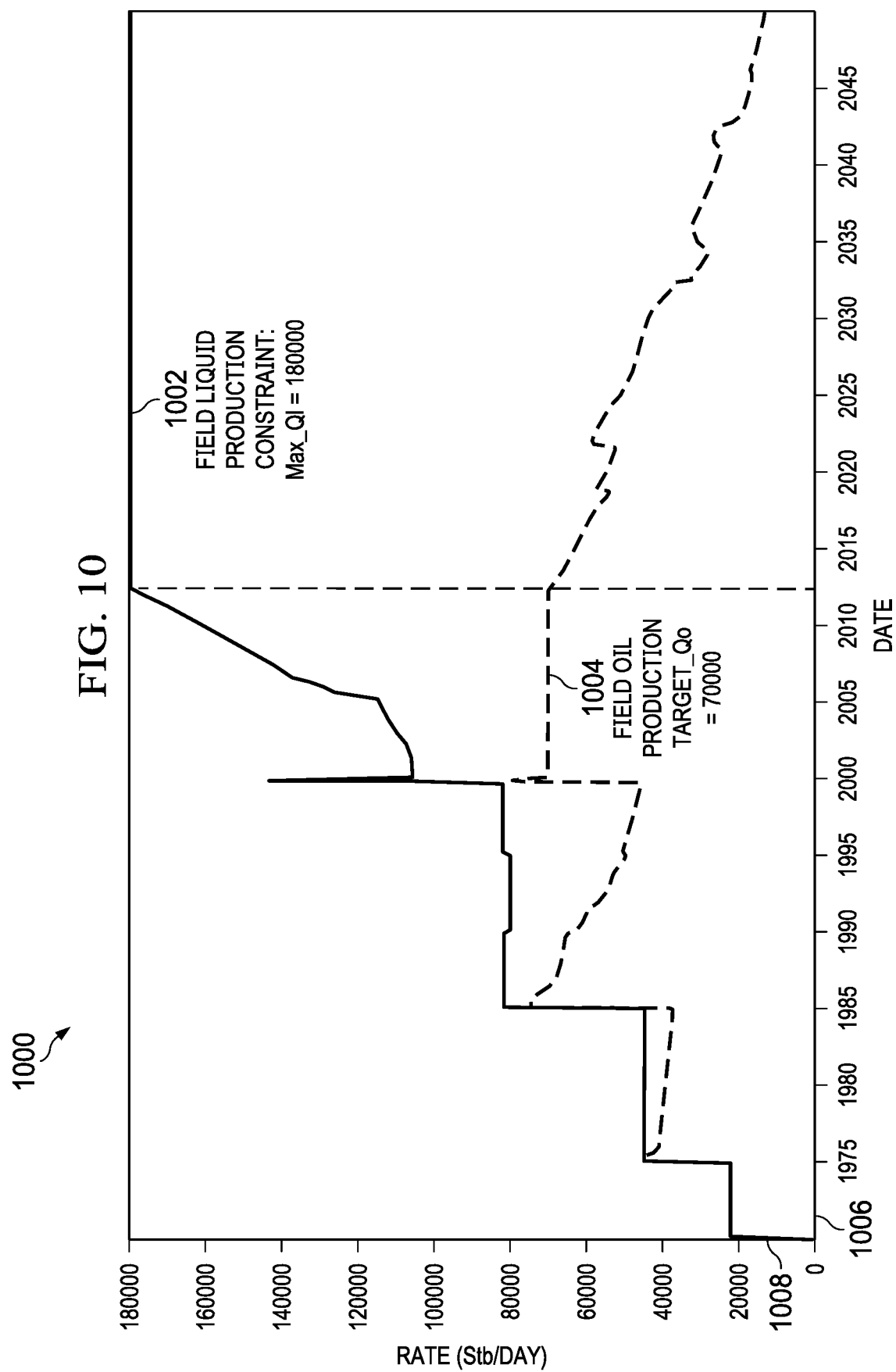
FIG. 10 is a graph showing an example of the results of a reference run without field management of control devices, according to some implementations of the present disclosure.

FIG. 10 is a graph 1000 showing an example of the results of a reference run without field management of control devices, according to some implementations of the present disclosure. The graph 1000 shows that the field is declined after June, 2012, and is constrained by maximum allowed liquid handling capacity. This is shown by a liquid field production 1002 (maximum Ql constraint of 180,000) and a field oil production 1004 (target quantity of oil (Qo) of 70,000), plotted relative to a date axis 1006 (years) and a rate axis 1008 (STBD).

Figure 11:
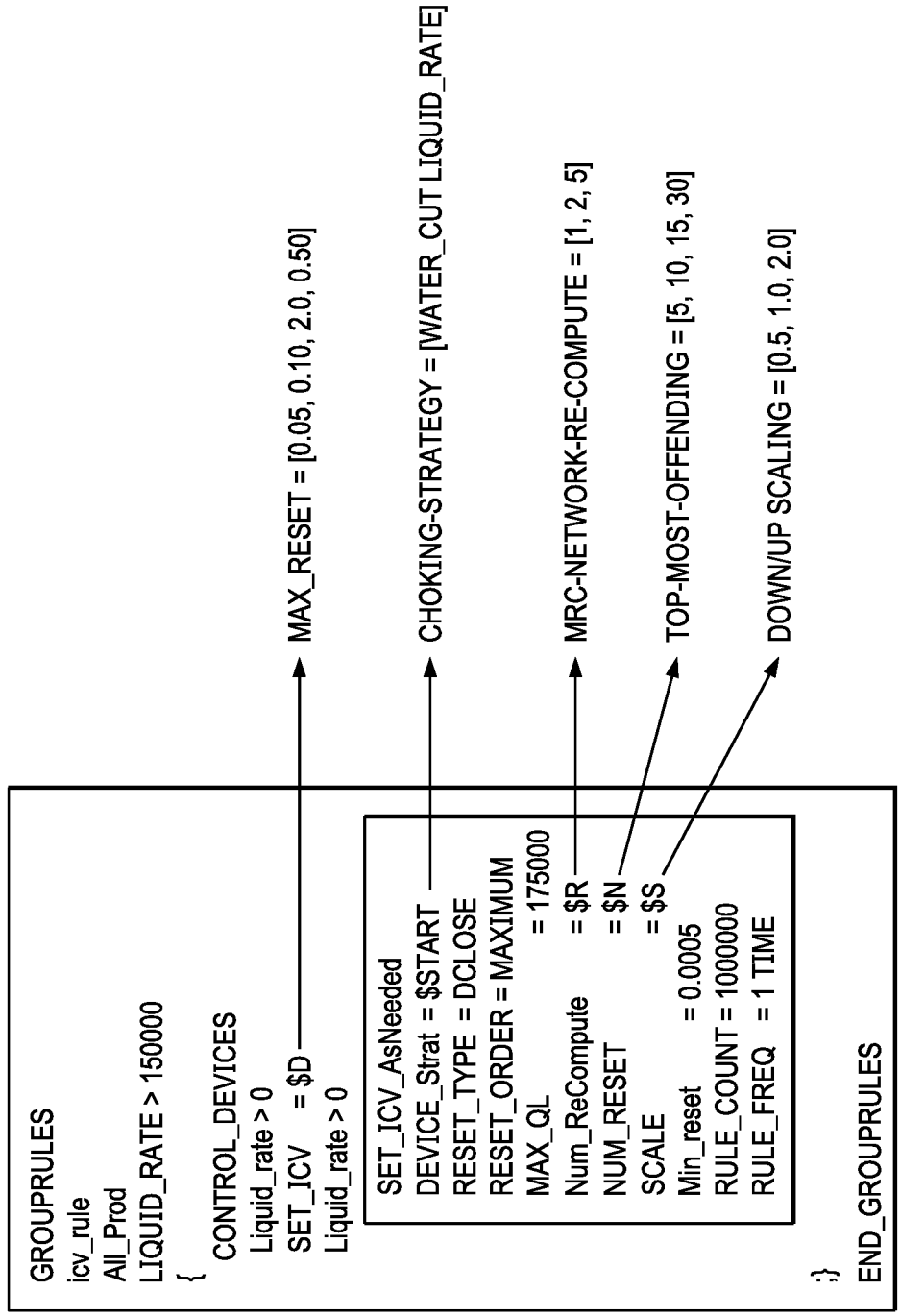
FIG. 11 is a diagram showing an example of rules, including a field management rule parameterized using an advance control policy designed to optimize field production, according to some implementations of the present disclosure.

FIG. 11 is a diagram showing an example of rules 1100, including a field management rule parameterized using an advance control policy designed to optimize field production, according to some implementations of the present disclosure. Rules such as the rules 1100 can be developed by studying multiple scenarios using the advanced control policy in which different control parameters are specified. The advanced control policy can be parameterized, for example, by changing a maximum reset value (for example, an upper limit for reset/choking factor), a choking strategy, and a choking subject to a liquid constraint used in conjunction with different numbers of network re-computations. In addition, an option to control most-offending devices and an option to upscale and down scale can also be parameterized. In experiments using such parameterizing rules, 288 cases were simulated, each with different control settings. The results obtained are shown in FIGS. 12A-12B.

Figure 12A:
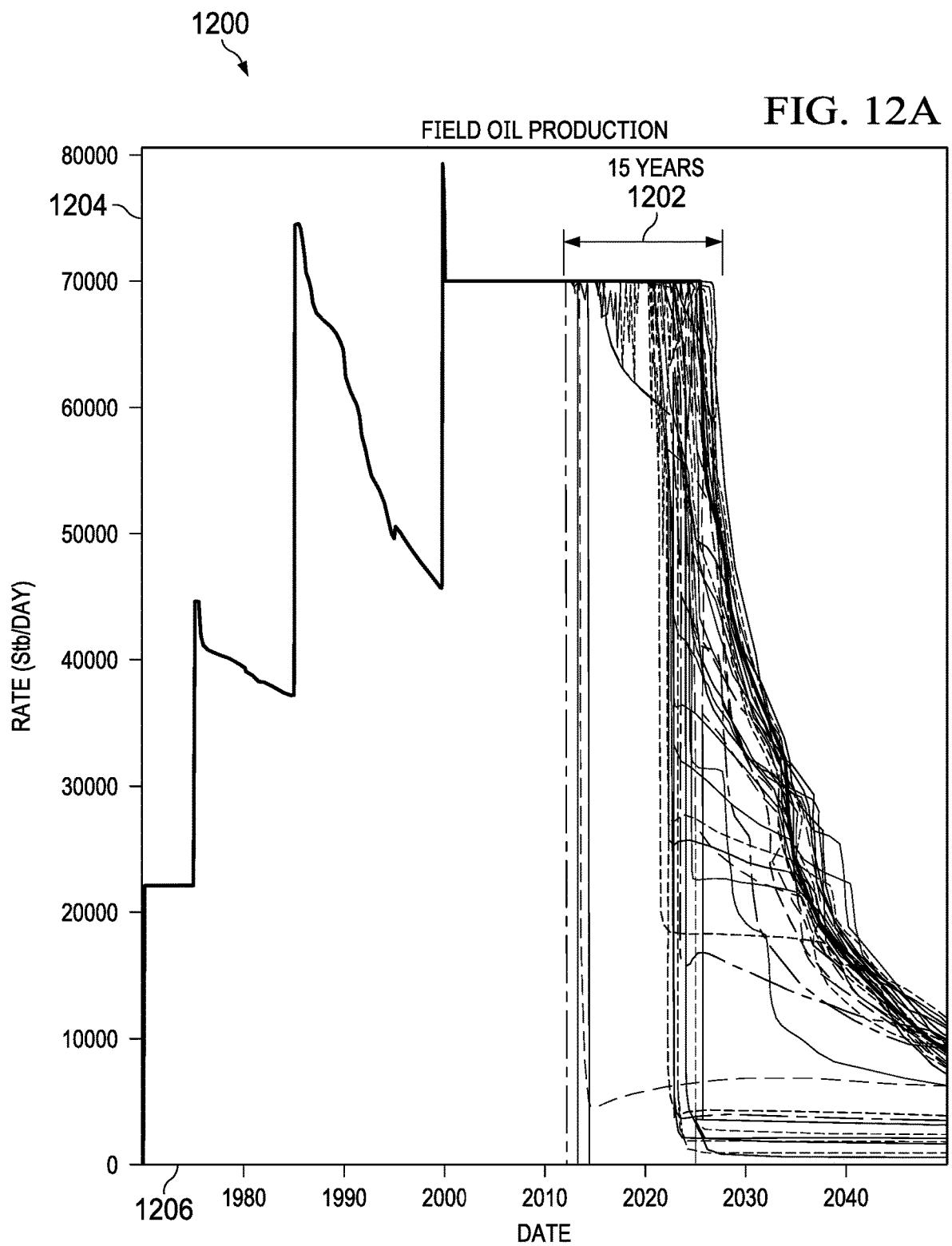
FIGS. 12A-12B include graphs depicting an example of sensitivity analysis using the advanced control policy to optimize field production, according to some implementations of the present disclosure.
Figure 12B:
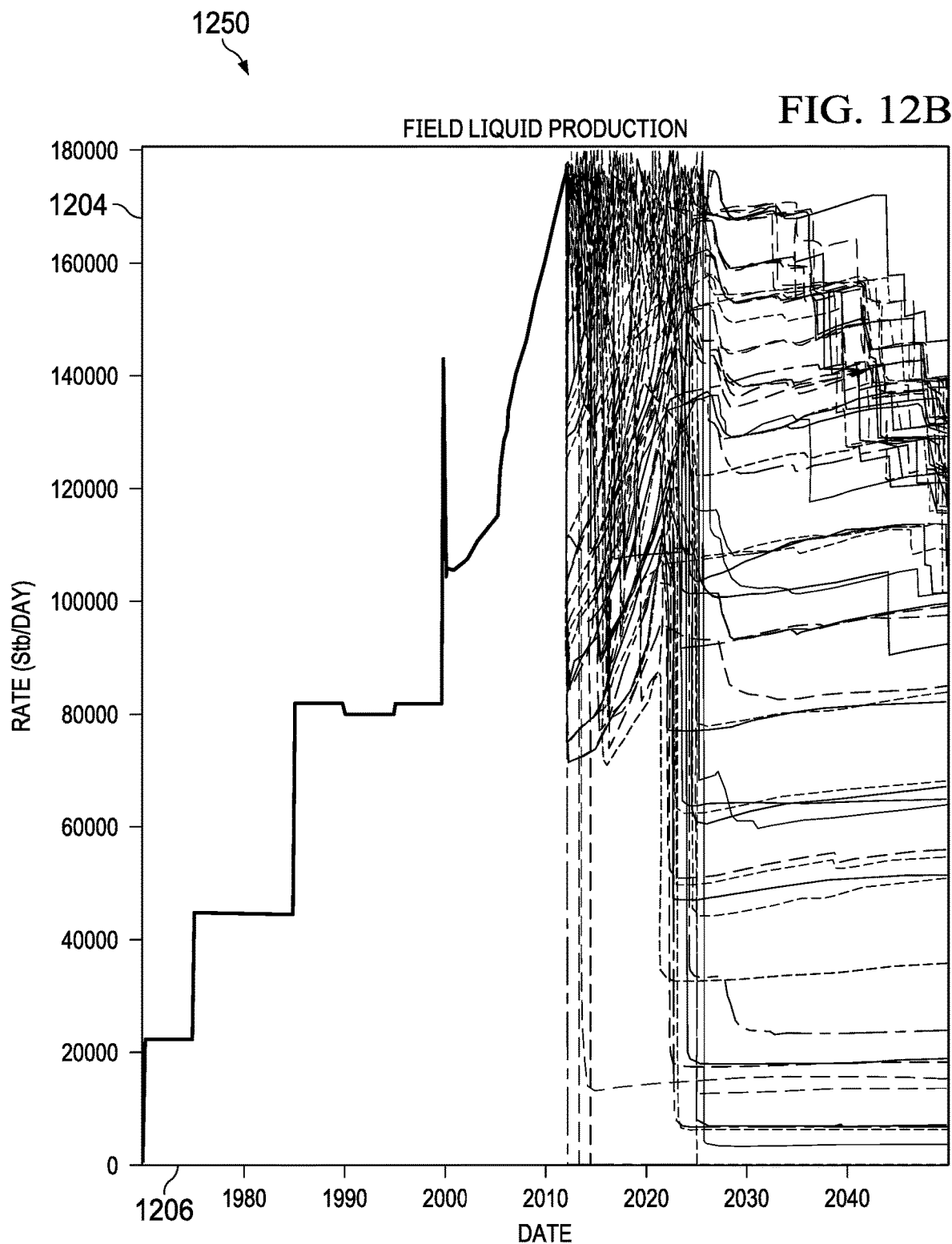

FIGS. 12A-12B include graphs 1200 and 1250 depicting an example of sensitivity analysis using the advanced control policy to optimize field production, according to some implementations of the present disclosure. The field oil production graph 1200 shows oil production over a period 1202 of 15 years, where the production is plotted relative to a production rate 1204 (STBD) and time 1206 (years). The field liquid production graph 1250 shows liquid production over the same time 1206 as the field oil production graph 1200. The graphs 1200 and 1250 show that production can be optimized by controlling ICVs. In the current case, for example, a setting of ICVs exists which, if selected, can allow the field to be operated at a target oil rate up to 15 years more. In this way, a 120% increase in plateau can be achieved with more recovery.

Figure 13:
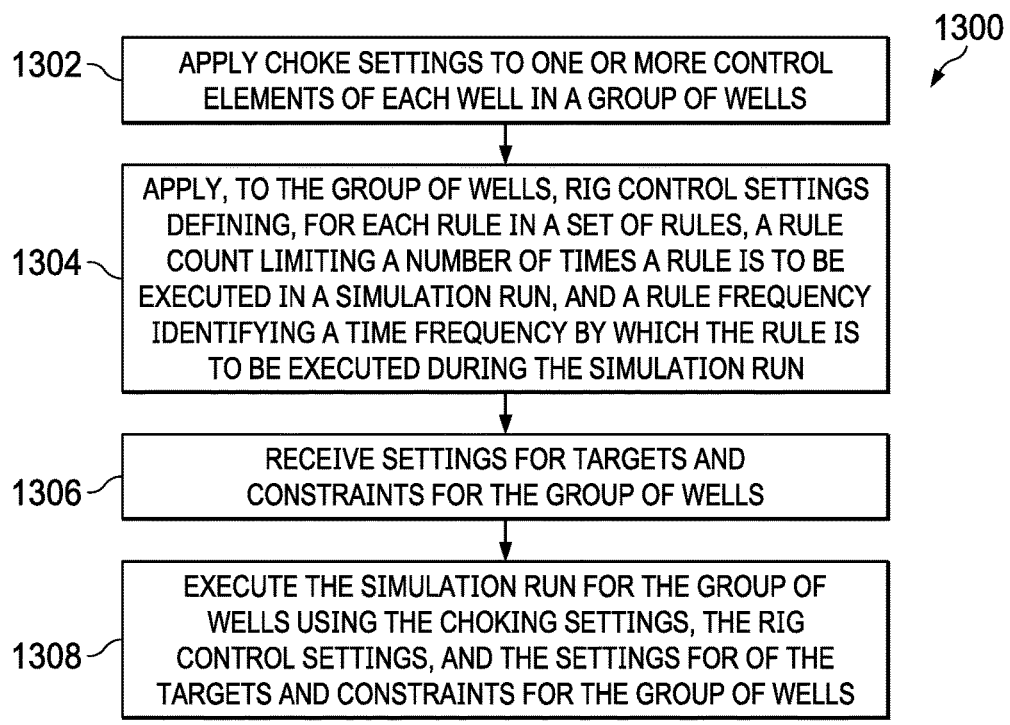
FIG. 13 is a flowchart of an example of a method for performing an advanced control policy for a group of wells, according to some implementations of the present disclosure.

FIG. 13 is a flowchart of an example of a method 1300 for performing an advanced control policy for a group of wells, according to some implementations of the present disclosure. For clarity of presentation, the description that follows generally describes method 1300 in the context of the other figures in this description. However, it will be understood that method 1300 can be performed, for example, by any suitable system, environment, software, and hardware, or a combination of systems, environments, software, and hardware, as appropriate. In some implementations, various steps of method 1300 can be run in parallel, in combination, in loops, or in any order.

At 1302, choke settings are applied to one or more control elements of each well in a group of wells. For example, applying the choke settings can include determining wells in the group of wells passing a threshold in a set of triggers. For each well passing the threshold, a choking strategy can be determined for the well. The well can be re-set with the choking strategy. An upscale/downscale factor can be applied to increase/decrease the effects of choking on the well. A maximum/minimum choking factor can be applied to each well in the group of wells to limit the effects of choking that are increased/decreased by the upscale/downscale factor. The one or more control elements can include, for example, ICVs, ICDs, perforations, and branches of a complex well. In some implementations, determining the wells in the group of wells passing the threshold in the set of triggers can include identifying offending control elements using three layers of triggers, including group triggers, well triggers, and device triggers. In some implementations, triggering or selection conditions for ICV devices can include absolute rates or fluid fractions/ratios.

In some implementations, a control element can be reconfigured to optimize field production for the group of wells. Control actions can be performed as needed to avoid performing unnecessary choking or more choking than is required in order to prevent impacts to field potential and adversely affecting the targets. From 1302, method 1300 proceeds to 1304.

At 1304, rig control settings are applied to the group of wells. The rig control settings define, for each rule in a set of rules: a rule count limiting a number of times a rule is to be executed in a simulation run and a rule frequency identifying a time frequency by which the rule is to be executed during the simulation run. The set of rules can include rules that are defined in a form of absolute rates or fluid fractions/ratios. In some implementations, a group's set of rules can be transferred and applied directly to ICV devices in subordinate wells of the group while honoring constraints and rules of the group of wells. From 1304, method 1300 proceeds to 1306.

At 1306, settings are received for targets and constraints for the group of wells. In some implementations, method 1300 further includes receiving user inputs to control performance of the advanced control policy for the group of wells and executing the advanced control policy based on the user inputs. For example, a graphical user interface can be used to provide a way for a petroleum engineer or other user to input parameters to use in the system. The user inputs can include control actions that are dynamic and change with each simulation run. From 1306, method 1300 proceeds to 1308.

At 1308, the simulation run is executed for the group of wells using the choking settings, the rig control settings, and the settings for of the targets and constraints for the group of wells. After 1308, method 1300 can stop.

Figure 14:
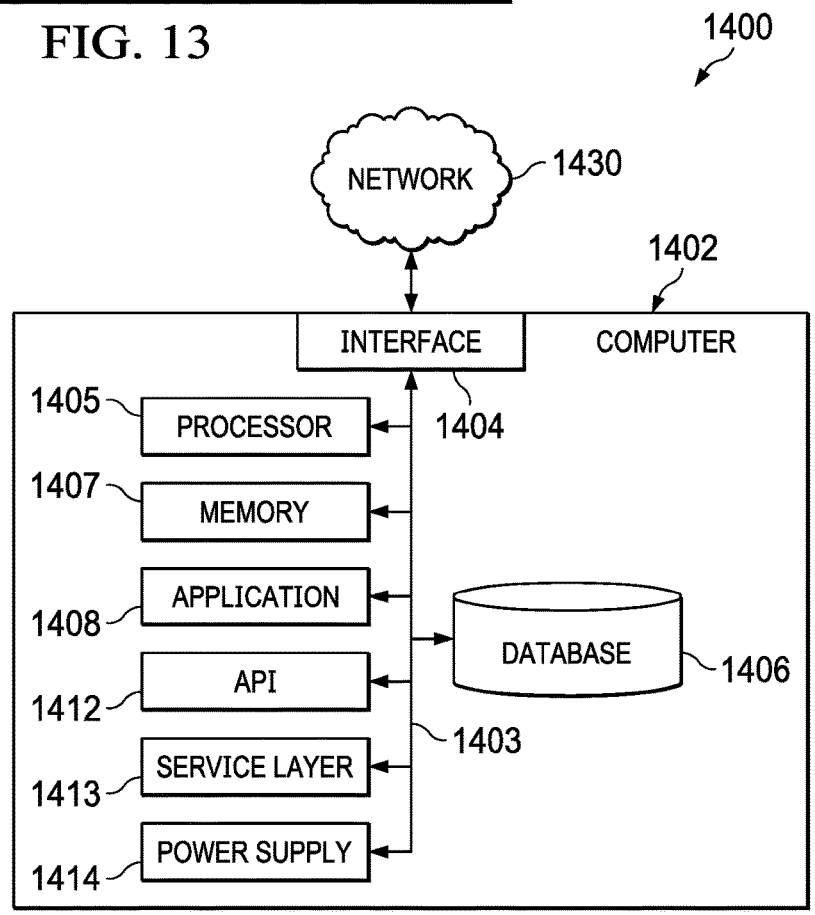
FIG. 14 is a block diagram illustrating an example computer system used to provide computational functionalities associated with described algorithms, methods, functions, processes, flows, and procedures as described in the present disclosure, according to some implementations of the present disclosure.

FIG. 14 is a block diagram of an example computer system 1400 used to provide computational functionalities associated with described algorithms, methods, functions, processes, flows, and procedures described in the present disclosure, according to some implementations of the present disclosure. The illustrated computer 1402 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 1402 can include input devices such as keypads, keyboards, and touch screens that can accept user information. Also, the computer 1402 can include output devices that can convey information associated with the operation of the computer 1402. The information can include digital data, visual data, audio information, or a combination of information. The information can be presented in a graphical user interface (UI) (or GUI).

The computer 1402 can serve in a role as a client, a network component, a server, a database, a persistency, or components of a computer system for performing the subject matter described in the present disclosure. The illustrated computer 1402 is communicably coupled with a network 1430. In some implementations, one or more components of the computer 1402 can be configured to operate within different environments, including cloud-computing-based environments, local environments, global environments, and combinations of environments.

At a top level, the computer 1402 is an electronic computing device operable to receive, transmit, process, store, and manage data and information associated with the described subject matter. According to some implementations, the computer 1402 can also include, or be communicably coupled with, an application server, an email server, a web server, a caching server, a streaming data server, or a combination of servers.

The computer 1402 can receive requests over network 1430 from a client application (for example, executing on another computer 1402). The computer 1402 can respond to the received requests by processing the received requests using software applications. Requests can also be sent to the computer 1402 from internal users (for example, from a command console), external (or third) parties, automated applications, entities, individuals, systems, and computers.

Each of the components of the computer 1402 can communicate using a system bus 1403. In some implementations, any or all of the components of the computer 1402, including hardware or software components, can interface with each other or the interface 1404 (or a combination of both) over the system bus 1403. Interfaces can use an application programming interface (API) 1412, a service layer 1413, or a combination of the API 1412 and service layer 1413. The API 1412 can include specifications for routines, data structures, and object classes. The API 1412 can be either computer-language independent or dependent. The API 1412 can refer to a complete interface, a single function, or a set of APIs.

The service layer 1413 can provide software services to the computer 1402 and other components (whether illustrated or not) that are communicably coupled to the computer 1402. The functionality of the computer 1402 can be accessible for all service consumers using this service layer. Software services, such as those provided by the service layer 1413, can provide reusable, defined functionalities through a defined interface. For example, the interface can be software written in JAVA, C++, or a language providing data in extensible markup language (XML) format. While illustrated as an integrated component of the computer 1402, in alternative implementations, the API 1412 or the service layer 1413 can be stand-alone components in relation to other components of the computer 1402 and other components communicably coupled to the computer 1402. Moreover, any or all parts of the API 1412 or the service layer 1413 can be implemented as child or sub-modules of another software module, enterprise application, or hardware module without departing from the scope of the present disclosure.

The computer 1402 includes an interface 1404. Although illustrated as a single interface 1404 in FIG. 14, two or more interfaces 1404 can be used according to particular needs, desires, or particular implementations of the computer 1402 and the described functionality. The interface 1404 can be used by the computer 1402 for communicating with other systems that are connected to the network 1430 (whether illustrated or not) in a distributed environment. Generally, the interface 1404 can include, or be implemented using, logic encoded in software or hardware (or a combination of software and hardware) operable to communicate with the network 1430. More specifically, the interface 1404 can include software supporting one or more communication protocols associated with communications. As such, the network 1430 or the interface's hardware can be operable to communicate physical signals within and outside of the illustrated computer 1402.

The computer 1402 includes a processor 1405. Although illustrated as a single processor 1405 in FIG. 14, two or more processors 1405 can be used according to particular needs, desires, or particular implementations of the computer 1402 and the described functionality. Generally, the processor 1405 can execute instructions and can manipulate data to perform the operations of the computer 1402, including operations using algorithms, methods, functions, processes, flows, and procedures as described in the present disclosure.

The computer 1402 also includes a database 1406 that can hold data for the computer 1402 and other components connected to the network 1430 (whether illustrated or not). For example, database 1406 can be an in-memory, conventional, or a database storing data consistent with the present disclosure. In some implementations, database 1406 can be a combination of two or more different database types (for example, hybrid in-memory and conventional databases) according to particular needs, desires, or particular implementations of the computer 1402 and the described functionality. Although illustrated as a single database 1406 in FIG. 14, two or more databases (of the same, different, or combination of types) can be used according to particular needs, desires, or particular implementations of the computer 1402 and the described functionality. While database 1406 is illustrated as an internal component of the computer 1402, in alternative implementations, database 1406 can be external to the computer 1402.

The computer 1402 also includes a memory 1407 that can hold data for the computer 1402 or a combination of components connected to the network 1430 (whether illustrated or not). Memory 1407 can store any data consistent with the present disclosure. In some implementations, memory 1407 can be a combination of two or more different types of memory (for example, a combination of semiconductor and magnetic storage) according to particular needs, desires, or particular implementations of the computer 1402 and the described functionality. Although illustrated as a single memory 1407 in FIG. 14, two or more memories 1407 (of the same, different, or combination of types) can be used according to particular needs, desires, or particular implementations of the computer 1402 and the described functionality. While memory 1407 is illustrated as an internal component of the computer 1402, in alternative implementations, memory 1407 can be external to the computer 1402.

The application 1408 can be an algorithmic software engine providing functionality according to particular needs, desires, or particular implementations of the computer 1402 and the described functionality. For example, application 1408 can serve as one or more components, modules, or applications. Further, although illustrated as a single application 1408, the application 1408 can be implemented as multiple applications 1408 on the computer 1402. In addition, although illustrated as internal to the computer 1402, in alternative implementations, the application 1408 can be external to the computer 1402.

The computer 1402 can also include a power supply 1414. The power supply 1414 can include a rechargeable or non-rechargeable battery that can be configured to be either user- or non-user-replaceable. In some implementations, the power supply 1414 can include power-conversion and management circuits, including recharging, standby, and power management functionalities. In some implementations, the power-supply 1414 can include a power plug to allow the computer 1402 to be plugged into a wall socket or a power source to, for example, power the computer 1402 or recharge a rechargeable battery.

There can be any number of computers 1402 associated with, or external to, a computer system containing computer 1402, with each computer 1402 communicating over network 1430. Further, the terms "client," "user," and other appropriate terminology can be used interchangeably, as appropriate, without departing from the scope of the present disclosure. Moreover, the present disclosure contemplates that many users can use one computer 1402 and one user can use multiple computers 1402.

Described implementations of the subject matter can include one or more features, alone or in combination.

For example, in a first implementation, a computer-implemented method includes the following. Choke settings are applied to one or more control elements of each well in a group of wells. Rig control settings are applied to the group of wells. The rig control settings define, for each rule in a set of rules: a rule count limiting a number of times a rule is to be executed in a simulation run and a rule frequency identifying a time frequency by which the rule is to be executed during the simulation run. Settings are received for targets and constraints for the group of wells. The simulation run is executed for the group of wells using the choking settings, the rig control settings, and the settings for of the targets and constraints for the group of wells.

The foregoing and other described implementations can each, optionally, include one or more of the following features:

A first feature, combinable with any of the following features, where applying the choke settings includes: determining wells in the group of wells passing a threshold in a set of triggers; and for each well passing the threshold: determining a choking strategy for the well; re-setting the well with the choking strategy; applying an upscale/downscale factor to increase/decrease the effects of choking on the well; and applying, to each well in the group of wells, a maximum/minimum choking factor to which to limit the effects of choking that are increased/decreased by the upscale/downscale factor.

A second feature, combinable with any of the previous or following features, where the one or more control elements include inflow control valves (ICVs), inflow control devices (ICDs), perforations, and branches of a complex well.

A third feature, combinable with any of the previous or following features, where determining the wells in the group of wells passing the threshold in the set of triggers comprises identifying offending control elements using three layers of triggers, including group triggers, well triggers, and device triggers.

A fourth feature, combinable with any of the previous or following features, the method further including receiving user inputs to control performance of the advanced control policy for the group of wells and executing the advanced control policy based on the user inputs.

A fifth feature, combinable with any of the previous or following features, the method further including reconfiguring a control element to optimize field production for the group of wells.

A sixth feature, combinable with any of the previous or following features, where control actions are performed as needed to avoid performing unnecessary choking or more choking than is required in order to prevent impacts to field potential and adversely affecting the targets.

A seventh feature, combinable with any of the previous or following features, the user inputs include control actions that are dynamic and change with each simulation run.

An eighth feature, combinable with any of the previous or following features, the method further including transferring and applying a group's set of rules directly to ICV devices in subordinate wells of the group while honoring constraints and rules of the group of wells.

A ninth feature, combinable with any of the previous or following features, where the set of rules includes rules that are defined in a form of absolute rates or fluid fractions/ratios.

A tenth feature, combinable with any of the previous or following features, where triggering or selection conditions for ICV devices include absolute rates or fluid fractions/ratios.

An eleventh feature, combinable with any of the previous or following features, where an advanced control policy is reversible and is updated frequently to allow ICV positions to be reset and production conditions to be changed.

In a second implementation, a non-transitory, computer-readable medium stores one or more instructions executable by a computer system to perform operations including the following. Choke settings are applied to one or more control elements of each well in a group of wells. Rig control settings are applied to the group of wells. The rig control settings define, for each rule in a set of rules: a rule count limiting a number of times a rule is to be executed in a simulation run and a rule frequency identifying a time frequency by which the rule is to be executed during the simulation run. Settings are received for targets and constraints for the group of wells. The simulation run is executed for the group of wells using the choking settings, the rig control settings, and the settings for of the targets and constraints for the group of wells.

The foregoing and other described implementations can each, optionally, include one or more of the following features:

A first feature, combinable with any of the following features, where applying the choke settings includes: determining wells in the group of wells passing a threshold in a set of triggers; and for each well passing the threshold: determining a choking strategy for the well; re-setting the well with the choking strategy; applying an upscale/downscale factor to increase/decrease the effects of choking on the well; and applying, to each well in the group of wells, a maximum/minimum choking factor to which to limit the effects of choking that are increased/decreased by the upscale/downscale factor.

A second feature, combinable with any of the previous or following features, where the one or more control elements include inflow control valves (ICVs), inflow control devices (ICDs), perforations, and branches of a complex well.

A third feature, combinable with any of the previous or following features, where determining the wells in the group of wells passing the threshold in the set of triggers comprises identifying offending control elements using three layers of triggers, including group triggers, well triggers, and device triggers.

In a third implementation, a computer-implemented system includes one or more processors and a non-transitory computer-readable storage medium coupled to the one or more processors and storing programming instructions for execution by the one or more processors. The programming instructions instruct the one or more processors to perform operations including the following. Choke settings are applied to one or more control elements of each well in a group of wells. Rig control settings are applied to the group of wells. The rig control settings define, for each rule in a set of rules: a rule count limiting a number of times a rule is to be executed in a simulation run and a rule frequency identifying a time frequency by which the rule is to be executed during the simulation run. Settings are received for targets and constraints for the group of wells. The simulation run is executed for the group of wells using the choking settings, the rig control settings, and the settings for of the targets and constraints for the group of wells.

The foregoing and other described implementations can each, optionally, include one or more of the following features:

A first feature, combinable with any of the following features, where applying the choke settings includes: determining wells in the group of wells passing a threshold in a set of triggers; and for each well passing the threshold: determining a choking strategy for the well; re-setting the well with the choking strategy; applying an upscale/downscale factor to increase/decrease the effects of choking on the well; and applying, to each well in the group of wells, a maximum/minimum choking factor to which to limit the effects of choking that are increased/decreased by the upscale/downscale factor.

A second feature, combinable with any of the previous or following features, where the one or more control elements include inflow control valves (ICVs), inflow control devices (ICDs), perforations, and branches of a complex well.

A third feature, combinable with any of the previous or following features, where determining the wells in the group of wells passing the threshold in the set of triggers comprises identifying offending control elements using three layers of triggers, including group triggers, well triggers, and device triggers.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. For example, the signal can be a machine-generated electrical, optical, or electromagnetic signal that is generated to encode information for transmission to a suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatuses, devices, and machines for processing data, including by way of example, a programmable processor, a computer, or multiple processors or computers. The apparatus can also include special purpose logic circuitry including, for example, a central processing unit (CPU), a field-programmable gate array (FPGA), or an application-specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, such as LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub-programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory.

Graphics processing units (GPUs) can also be used in combination with CPUs. The GPUs can provide specialized processing that occurs in parallel to processing performed by CPUs. The specialized processing can include artificial intelligence (AI) applications and processing, for example. GPUs can be used in GPU clusters or in multi-GPU computing.

A computer can include, or be operatively coupled to, one or more mass storage devices for storing data. In some implementations, a computer can receive data from, and transfer data to, the mass storage devices including, for example, magnetic, magneto-optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer-readable media (transitory or non-transitory, as appropriate) suitable for storing computer program instructions and data can include all forms of permanent/non-permanent and volatile/non-volatile memory, media, and memory devices. Computer-readable media can include, for example, semiconductor memory devices such as random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer-readable media can also include, for example, magnetic devices such as tape, cartridges, cassettes, and internal/removable disks. Computer-readable media can also include magneto-optical disks and optical memory devices and technologies including, for example, digital video disc (DVD), CD-ROM, DVD+/−R, DVD-RAM, DVD-ROM, HD-DVD, and BLU-RAY.

The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated into, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that the user uses. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch-screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back-end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations. It should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system including a computer memory interoperably coupled with a hardware processor configured to perform the computer-implemented method or the instructions stored on the non-transitory, computer-readable medium.

What is claimed is:

1. A computer-implemented method for performing an advanced control policy for a group of wells, comprising:
   applying choke settings to one or more control elements of each well in a group of wells, wherein applying the choke settings comprises:
      determining wells in the group of wells passing a threshold in a set of triggers; and
      for each well passing the threshold:
         determining a choking strategy for the well;
         re-setting the well with the choking strategy;
         applying an upscale/downscale factor to increase/decrease effects of choking on the well; and
         applying, to each well in the group of wells, a maximum/minimum choking factor to which to limit the effects of choking that are increased/decreased by the upscale/downscale factor;
   applying, to the group of wells, rig control settings defining, for each rule in a set of rules:
      a rule count limiting a number of times a rule is to be executed in a simulation run; and
      a rule frequency identifying a time frequency by which the rule is to be executed during the simulation run;
   receiving settings for targets and constraints for the group of wells; and
   executing the simulation run for the group of wells using the choking settings, the rig control settings, and the settings for the targets and the constraints for the group of wells.

2. The computer-implemented method of claim 1, wherein the one or more control elements include inflow control valves (ICVs), inflow control devices (ICDs), perforations, and branches of a complex well.

3. The computer-implemented method of claim 1, wherein determining the wells in the group of wells passing the threshold in the set of triggers comprises identifying offending control elements using three layers of triggers, including group triggers, well triggers, and device triggers.

4. The computer-implemented method of claim 1, further comprising:
   receiving user inputs to control performance of the advanced control policy for the group of wells; and
   executing the advanced control policy based on the user inputs.

5. The computer-implemented method of claim 4, wherein the user inputs include control actions that are dynamic and change with each simulation run.

6. The computer-implemented method of claim 1, further comprising reconfiguring a control element to optimize field production for the group of wells.

7. The computer-implemented method of claim 1, wherein control actions are performed as needed to avoid performing unnecessary choking or more choking than is required in order to prevent impacts to field potential and adversely affecting the targets.

8. The computer-implemented method of claim 1, further comprising transferring and applying a group's set of rules directly to ICV devices in subordinate wells of the group while honoring constraints and rules of the group of wells.

9. The computer-implemented method of claim 1, wherein the set of rules includes rules that are defined in a form of absolute rates or fluid fractions/ratios.

10. The computer-implemented method of claim 1, wherein triggering or selection conditions for ICV devices include absolute rates or fluid fractions/ratios.

11. The computer-implemented method of claim 1, wherein an advanced control policy is reversible and is updated frequently to allow ICV positions to be reset and production conditions to be changed.

12. A non-transitory, computer-readable medium storing one or more instructions executable by a computer system to perform operations comprising:
   applying choke settings to one or more control elements of each well in a group of wells wherein applying the choke settings comprises:
      determining wells in the group of wells passing a threshold in a set of triggers; and
      for each well passing the threshold:
         determining a choking strategy for the well;
         re-setting the well with the choking strategy;
         applying an upscale/downscale factor to increase/decrease effects of choking on the well; and
      applying, to each well in the group of wells, a maximum/minimum choking factor to which to limit the effects of choking that are increased/decreased by the upscale/downscale factor;
   applying, to the group of wells, rig control settings defining, for each rule in a set of rules:
      a rule count limiting a number of times a rule is to be executed in a simulation run; and
      a rule frequency identifying a time frequency by which the rule is to be executed during the simulation run;

receiving settings for targets and constraints for the group of wells; and executing the simulation run for the group of wells using the choking settings, the rig control settings, and the settings for the targets and the constraints for the group of wells.

13. The non-transitory, computer-readable medium of claim 12, wherein the one or more control elements include inflow control valves (ICVs), inflow control devices (ICDs), perforations, and branches of a complex well.

14. The non-transitory, computer-readable medium of claim 12, wherein determining the wells in the group of wells passing the threshold in the set of triggers comprises identifying offending control elements using three layers of triggers, including group triggers, well triggers, and device triggers.

15. A computer-implemented system, comprising:
one or more processors; and
a non-transitory computer-readable storage medium coupled to the one or more processors and storing programming instructions for execution by the one or more processors, the programming instructions instructing the one or more processors to perform operations comprising:
   applying choke settings to one or more control elements of each well in a group of wells, wherein applying the choke settings comprises:
      determining wells in the group of wells passing a threshold in a set of triggers; and
      for each well passing the threshold:
         determining a choking strategy for the well;
         re-setting the well with the choking strategy;
         applying an upscale/downscale factor to increase/decrease effects of choking on the well; and
         applying, to each well in the group of wells, a maximum/minimum choking factor to which to limit the effects of choking that are increased/decreased by the upscale/downscale factor;
   applying, to the group of wells, rig control settings defining, for each rule in a set of rules:
      a rule count limiting a number of times a rule is to be executed in a simulation run; and
      a rule frequency identifying a time frequency by which the rule is to be executed during the simulation run;
   receiving settings for targets and constraints for the group of wells; and
   executing the simulation run for the group of wells using the choking settings, the rig control settings, and the settings for the targets and the constraints for the group of wells.

16. The computer-implemented system of claim 15, wherein the one or more control elements include inflow control valves (ICVs), inflow control devices (ICDs), perforations, and branches of a complex well.

17. The computer-implemented system of claim 15, wherein determining the wells in the group of wells passing the threshold in the set of triggers comprises identifying offending control elements using three layers of triggers, including group triggers, well triggers, and device triggers.

* * * * *